(12) United States Patent
Mizoguchi

(10) Patent No.: US 8,741,677 B2
(45) Date of Patent: Jun. 3, 2014

(54) DISPLAY DEVICE AND MANUFACTURING METHOD OF THE SAME

(75) Inventor: Takafumi Mizoguchi, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 27 days.

(21) Appl. No.: 13/306,066

(22) Filed: Nov. 29, 2011

(65) Prior Publication Data
US 2012/0132918 A1 May 31, 2012

(30) Foreign Application Priority Data
Nov. 30, 2010 (JP) .................................. 2010-267505

(51) Int. Cl.
*H01L 21/00* (2006.01)

(52) U.S. Cl.
USPC .............. 438/34; 257/E21.369; 257/E33.062; 257/59; 257/72

(58) Field of Classification Search
USPC .......... 257/59, 72, E33.062, E21.369; 438/34
See application file for complete search history.

(56) References Cited

U.S. PATENT DOCUMENTS

| | | | |
|---|---|---|---|
| 6,709,901 B1 | 3/2004 | Yamazaki et al. | |
| 6,855,957 B1 | 2/2005 | Yamazaki et al. | |
| 6,933,533 B2 | 8/2005 | Yamazaki et al. | |
| 7,629,618 B2 | 12/2009 | Yamazaki et al. | |
| 8,013,346 B2 | 9/2011 | Yamazaki et al. | |
| 2002/0171085 A1* | 11/2002 | Suzawa et al. .............. | 257/72 |
| 2007/0177092 A1* | 8/2007 | Hosoya .................... | 349/149 |
| 2009/0114917 A1 | 5/2009 | Yamazaki et al. | |

FOREIGN PATENT DOCUMENTS

| | | |
|---|---|---|
| JP | 7-120790 | 5/1995 |
| JP | 2002-318555 | 10/2002 |
| JP | 2009-135482 | 6/2009 |

* cited by examiner

*Primary Examiner* — Elias M Ullah
(74) *Attorney, Agent, or Firm* — Husch Blackwell LLP

(57) ABSTRACT

A display device free of contact resistance between a drain electrode (or a source electrode) and a pixel electrode. The display device includes a gate electrode, a gate insulating layer covering the gate electrode, a semiconductor layer formed over the gate insulating layer, and a source electrode and a drain electrode separated from each other and in partial-contact with and over the semiconductor layer, and one of the source electrode and the drain electrode also serves as a pixel electrode, the other of the source electrode and the drain electrode also serves as a signal line, and a low resistant conductive layer is preferably formed over the other of the source electrode and the drain electrode. The low resistant conductive layer can be formed by an electroplating method or the like.

13 Claims, 17 Drawing Sheets

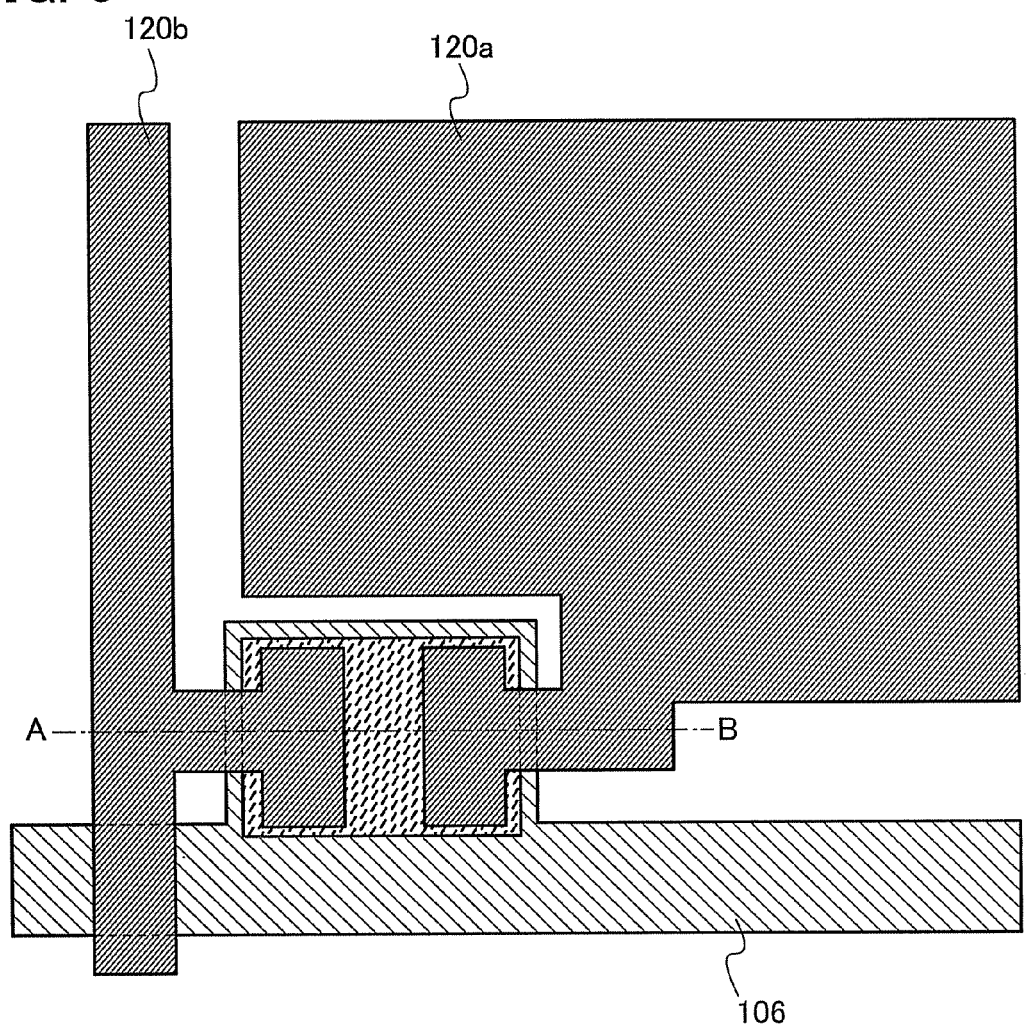

DISPLAY DEVICE AND MANUFACTURING METHOD OF THE SAME

BACKGROUND OF THE INVENTION

1. Field of the Invention

The present invention relates to a display device and a method for manufacturing the display device. Further, the present invention relates to a production system of the display device.

Note that the term "display device" in this specification includes pixel transistors included in a display device and an active matrix substrate provided with a plurality of pixel transistors, as well as the display device itself.

2. Description of the Related Art

In recent years, display devices such as liquid crystal display devices and EL display devices are spreading rapidly. Such display devices are classified roughly into passive matrix display devices and active matrix display devices. In an active matrix display device, an active matrix substrate in which a plurality of switching elements are provided in matrix is used. As a switching element, a transistor is usually used for example.

A general active matrix substrate is provided with a pixel transistor including: a thin film transistor which includes a scan line also serving as a gate electrode, a signal line also serving as a source electrode (or a drain electrode), a semiconductor layer, a drain electrode (or a source electrode); and a protective insulating layer covering the thin film transistor; and a pixel electrode connected to the drain electrode (or the source electrode) in an opening portion provided in the protective insulating layer.

In such an active matrix substrate, a contact resistance of a portion where the drain electrode (or the source electrode) is in contact with the pixel electrode in the opening portion is one of hindrances to improvement of display characteristics (for example, see paragraph [0005] in Patent Document 1).

In addition, in manufacturing an active matrix substrate, it is known that an increase in the number of masks used leads to an increase in the manufacturing cost. Thus, it is well-known that many approaches to reduce the number of masks used have been made, without needing to mention a reference.

Note that, in this specification, the term "mask" includes an etching mask, a photomask, and a protective mask. Note that the "photomask" means a mask layer used in light exposure in a photolithography method, the "etching mask" means a mask layer formed to prevent a film formed under the etching mask from being etched, and the "protective mask" means a mask layer formed to prevent a film formed over the protective mask from being in contact with a layer formed under the protective mask. Note that the "etching mask" and the "protective mask" can each be formed of a resist material, and thus can be referred to as a resist mask in some cases.

REFERENCE

[Patent Document 1] Japanese Published Patent Application No. H7-120790

[Patent Document 2] Japanese Published Patent Application No. 2002-318555

SUMMARY OF THE INVENTION

It is an object of one embodiment of the present invention to provide a display device free of contact resistance between a drain electrode (or a source electrode) and a pixel electrode.

It is another object of one embodiment of the present invention to provide a display device free of contact resistance between a drain electrode (or a source electrode) and a pixel electrode, without increasing a wiring resistance.

Further, it is another object of one embodiment of the present invention to provide a manufacturing method of a display device by which the number of masks can be smaller than that by a conventional method.

One embodiment of the present invention is a display device in which a drain electrode (or a source electrode) is formed in the same layer as a pixel electrode in an active matrix substrate.

One embodiment of the present invention is a display device including a gate electrode; a gate insulating layer formed to cover the gate electrode; a semiconductor layer formed over the gate insulating layer; and a source electrode and a drain electrode which are separated from each other and in contact with the semiconductor layer, wherein one of the source electrode and the drain electrode also serves as a pixel electrode.

Another embodiment of the present invention is a display device including a gate electrode; a gate insulating layer formed to cover the gate electrode; a semiconductor layer formed over the gate insulating layer; and a source electrode and a drain electrode separated from each other and in contact with the semiconductor layer, wherein one of the source electrode and the drain electrode also serves as a pixel electrode; the other of the source electrode and the drain electrode serves as a signal line; and a low resistant conductive layer is formed over the other of the source electrode and the drain electrode. Note that in this specification, the low resistant conductive layer may have a lower resistance than at least the electrode also serving as a signal line and the electrode also serving as a pixel electrode.

Another embodiment of the present invention is a method for manufacturing a display device, comprising the steps of forming a first conductive film over a substrate; forming a first etching mask over the first conductive film; processing the first conductive film with use of the first etching mask, whereby a gate electrode is formed; removing the first etching mask; forming a gate insulating layer over the gate electrode; forming a semiconductor film over the gate insulating layer; forming a second etching mask over the semiconductor film; processing the semiconductor film with use of the second etching mask, whereby a semiconductor layer is formed; removing the second etching mask; forming a transparent conductive film over the gate insulating layer to cover the semiconductor layer; forming a third etching mask over the transparent conductive film; processing the transparent conductive film with use of the third etching mask, whereby an electrode also serving as a signal line and an electrode also serving as a pixel electrode are formed; and removing the third etching mask. Note that after that, preferably, etching of an upper portion of the semiconductor layer is conducted to remove residue or the like left between the electrode also serving as a signal line and the electrode also serving as a pixel electrode.

Another embodiment of the present invention is a method for manufacturing a display device, comprising the steps of forming a first conductive film over a substrate; forming a first etching mask over the first conductive film; processing the first conductive film with use of the first etching mask, whereby a gate electrode is formed; removing the first etching mask; forming a gate insulating layer over the gate electrode; forming a semiconductor film over the gate insulating layer; forming a second etching mask over the semiconductor film; processing the semiconductor film with use of the second etching mask, whereby a semiconductor layer is formed; removing the second etching mask; forming a transparent conductive film over the gate insulating layer to cover the semiconductor layer; forming a third etching mask over the transparent conductive film; processing the transparent conductive film with use of the third etching mask, whereby an electrode also serving as a signal line and an electrode also serving as a pixel electrode are formed; removing the third etching mask; and forming a low resistant conductive layer only over the electrode also serving as the signal line. Note that after that, preferably etching of an upper portion of the semiconductor layer is conducted to remove residue or the like or the like left between the electrode also serving as a signal line and the electrode also serving as a pixel electrode.

In the manufacturing method of the above-described display device according to one embodiment of the present invention, the low resistant conductive layer may be a metal layer formed by an electroplating method. When the low resistant conductive layer is formed by an electroplating method, the substrate where elements up to and including the electrode also serving as a signal line and the electrode also serving as a pixel electrode are formed, and an anode formed of a metal to be used for plating or an insoluble metal are immersed in an electrolyte solution containing ions of the metal to be used for plating, so that a potential difference is generated between the anode and the electrode also serving as a signal line and thus cations are reduced on the surface of the electrode also serving as a signal line, and thereby a metal layer is formed. After that, preferably etching of an upper portion of the semiconductor layer is conducted to remove residue or the like left between the electrode also serving as a signal line and the electrode also serving as a pixel electrode. Further, the metal to be used for plating may be a metal having a low resistance and a low ionization tendency.

The technique by which a signal line is treated by an electroplating method is disclosed in e.g., Patent Document 2.

In addition, in the manufacturing method of the above-described display device according to one embodiment of the present invention, in order to generate a potential difference between the anode and the electrode also serving as a signal line when the metal layer is formed by an electroplating method, the potential input to the signal line may be supplied from an arm transporting the substrate on the surface in contact with a signal line side input terminal over the substrate. In other words, the arm transporting the substrate has a conductive layer in its portion in contact with the signal line side input terminal. Accordingly, one embodiment of the present invention is a production system of a display device, wherein the substrate where elements up to and including the electrode also serving as a signal line and the electrode also serving as a pixel electrode are formed according to the manufacturing method of the above-described display device according to one embodiment of the present invention is transported by the arm having a conductive layer in contact with the signal line side input terminal over the substrate, the substrate and an anode formed of a metal to be used for plating or an insoluble metal are immersed in an electrolyte solution containing ions of the metal to be used for plating with the substrate held by the arm so that a potential difference is generated between the anode and the conductive layer of the arm, and thereby a metal layer is formed on the surface of the electrode also serving as a signal line.

In the above-described display device according to one embodiment of the present invention, a sidewall insulating layer is preferably formed on the side surfaces of the electrode also serving as a signal line and the electrode also serving as a pixel electrode. In other words, in the manufacturing method of the display device according to one embodiment of the present invention, after removing the third etching mask, an insulating film (hereinafter, referred to as a sidewall insulating film) for formation of the sidewall insulating layer is formed over the gate insulating layer, the semiconductor layer, the electrode also serving as a signal line and the electrode also serving as a pixel electrode, and etch-back treatment is conducted to expose the electrode also serving as a signal line and the electrode also serving as a pixel electrode so that the sidewall insulating layer is formed, then, a low resistant conductive layer is preferably formed over the electrode also serving as a signal line by an electroplating method. The formation of the sidewall insulating layer in contact with the side surfaces of the electrode also serving as a signal line and the electrode also serving as a pixel electrode makes it possible to set the distance (channel length L) between the electrode also serving as a signal line and the electrode also serving as a pixel electrode at the time of processing the transparent conductive film, irrespective of the formation method of the low resistant conductive layer. Accordingly, the channel length can be prevented from varying from point to point within the substrate, and thus display unevenness (mura) of the display device can be prevented. After that, preferably, etching of an upper portion of the semiconductor layer is conducted to remove residue or the like left between the electrode also serving as a signal line and the electrode also serving as a pixel electrode.

In the manufacturing method of the display device according to one embodiment of the present invention, when the sidewall insulating layer is formed, the electrode also serving as a signal line and the electrode also serving as a pixel electrode are easily subjected to plasma damages. Therefore, after the electrode also serving as a signal line and the electrode also serving as a pixel electrode are formed, preferably, the surfaces of the electrodes are slightly etched, or subjected to wet etching or washing so that the plasma damages are removed.

Alternatively, in the manufacturing method of the display device according to one embodiment of the present invention, the low resistant conductive layer may be formed by a method other than an electroplating method. For example, the following method may be employed: after the third etching mask is removed, a protective mask is farmed by a method that does not use a photomask such as an inkjet method in a region excluding the region where the low resistant conductive layer will be formed, a low resistant conductive film is formed over the electrode also serving as a signal line and the protective mask, and then the protective mask is lifted off so that the low resistant conductive layer is formed. After the protective mask is removed, preferably, etching of an upper portion of the semiconductor layer is conducted to remove residue or the like left between the electrode also serving as a signal line and the electrode also serving as a pixel electrode.

Alternatively, in the manufacturing method of the display device according to one embodiment of the present invention, the low resistant conductive layer may be formed by a droplet-discharge method instead of a lift-off process. For example, the following method may be employed: after the third etching mask is removed, the low resistant conductive film is formed, a fourth etching mask is formed by a droplet-discharge method in the region where the low resistant conductive layer will be formed over the low resistant conductive film, the low resistant conductive film is processed with use of the fourth etching mask, so that the low resistant conductive layer is formed, and then the fourth etching mask is removed. After the fourth etching mask is removed, preferably, etching of an upper portion of the semiconductor layer is conducted to remove residue or the like left between the electrode also serving as a signal line and the electrode also serving as a pixel electrode.

The display device described above or a display device manufactured by the manufacturing method of the display device can be applied to display portions of electronic devices.

Note that in this specification, a "film" refers to a film which is formed over the entire surface of an object by a CVD method (including a plasma CVD method and the like), a sputtering method, or the like. On the other hand, a "layer" refers to a layer which is formed by processing a "film" or a layer which is formed over the entire surface of an object and does not require to be subjected to processing. However, the words "film" and "layer" are not necessarily distinguished in some cases.

Although an ohmic contact layer between a semiconductor layer and source and drain electrodes is not described in this specification, an ohmic contact layer is preferably provided between a semiconductor layer and source and drain electrodes. The ohmic contact layer can be formed in such a way that an element imparting one conductivity type (phosphorus, arsenic, or the like for an n-channel transistor, and boron or the like for a p-channel transistor) is added to a semiconductor layer.

According to one embodiment of the present invention, since a drain electrode (or a source electrode) also serves as a pixel electrode, a display device free of contact resistance between the drain electrode (or the source electrode) and the pixel electrode can be provided.

Further, in accordance with a preferable embodiment of the present invention, a low resistant conductive layer is provided over an electrode also serving as a source electrode (or drain electrode) and also serving as a signal line, and thereby a display device free of contact resistance between the drain electrode (or the source electrode) and the pixel electrode can be provided, without increasing a wiring resistance.

Furthermore, according to a manufacturing method of a display device as one embodiment of the present invention, the number of masks can be smaller than that in a conventional method.

BRIEF DESCRIPTION OF THE DRAWINGS

In the accompanying drawings:

FIG. 3 illustrates a pixel transistor according to one embodiment of the present invention;

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

Embodiment 1

In this embodiment, a pixel transistor formed in a display device, according to one embodiment of the present invention, and a fabrication method thereof will be described.

First, a fabrication method of a pixel transistor in this embodiment will be described. One feature of the fabrication method of a pixel transistor in this embodiment lies in that a first conductive film is formed over a substrate, a first etching mask is formed over the first conductive film, the first conductive film is processed with use of the first etching mask so that a gate electrode is formed, the first etching mask is removed, a gate insulating layer is formed to cover the gate electrode, a semiconductor film is formed over the gate insulating layer, a second etching mask is formed over the semiconductor film, the semiconductor film is processed with use of the second etching mask so that a semiconductor layer is formed, the second etching mask is removed, a transparent conductive film is formed to cover the semiconductor layer over the gate insulating layer, a third etching mask is formed over the transparent conductive film, the transparent conductive film is processed with use of the third etching mask so that an electrode also serving as a signal line and an electrode also serving as a pixel electrode are formed, and the third etching mask is removed.

Figure 1A:
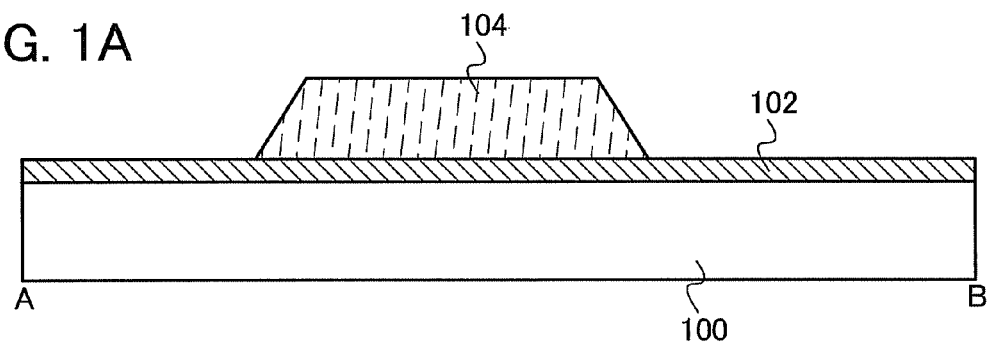
FIGS. 1A to 1D illustrate a fabrication method of a pixel transistor according to one embodiment of the present invention.

First, a first conductive film 102 is formed over a substrate 100, and a first etching mask 104 is formed over the first conductive film 102 (FIG. 1A).

Non-limiting examples of the substrate 100 includes a glass substrate, a quartz substrate, a silicon substrate, a stainless steel substrate, and a plastic substrate.

As the first conductive film 102, a conductive film (for example, a metal film, a semiconductor film doped with an impurity element imparting one conductivity type, or the like) may be formed by for example a sputtering method or a CVD method (including a plasma CVD method, a thermal CVD method, and the like). Alternatively, the first conductive film 102 may be formed by an inkjet method. Note that the first conductive film 102 may be formed to have either a single-layer structure or a stacked-layer structure including a plurality of layers. For example, the first conductive film 102 may be formed with a three-layer structure in which an Al layer is sandwiched between Ti layers or Mo layers.

As the first etching mask 104, for example, a resist mask may be formed; however, there is no particular limitation on the first etching mask 104, and any material that can be used as a mask in an etching step can be used.

Next, with the use of the first etching mask 104, the first conductive film 102 is processed so that the gate electrode 106 is formed (FIG. 1A).

Figure 1B:
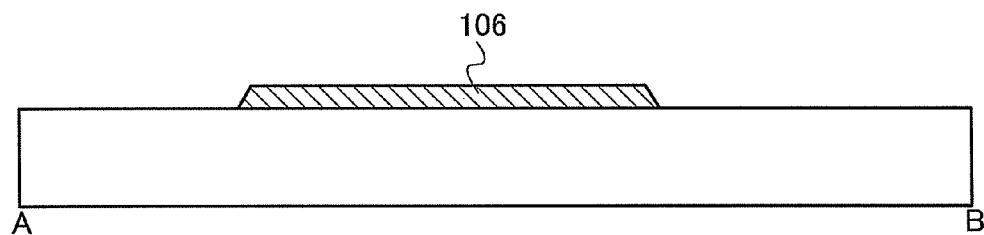

Then, the first etching mask 104 is removed (FIG. 1B).

Figure 1C:
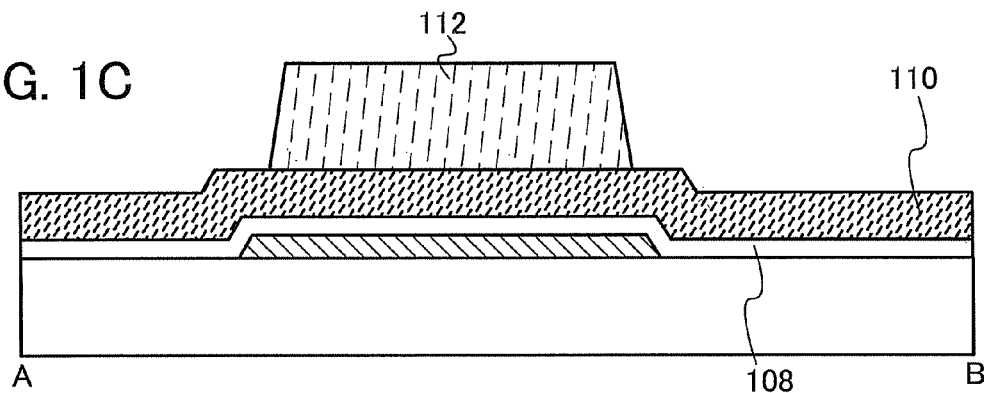

Then, a gate insulating layer 108 is formed to cover the gate electrode 106, a semiconductor film 110 is fowled over the gate insulating layer 108, and a second etching mask 112 is formed over the semiconductor film 110 (FIG. 1C).

As the gate insulating layer 108, for example, a film of an insulating material (for example, silicon nitride, silicon nitride oxide, silicon oxynitride, silicon oxide, or the like) may be formed by a method such as a sputtering method or a CVD method (including a plasma CVD method, a thermal CVD method, and the like). Note that the gate insulating layer 108 may be formed to have either a single-layer structure or a stacked-layer structure including a plurality of layers.

Note that "silicon nitride oxide" contains more nitrogen than oxygen and in the case where measurements are performed using Rutherford backscattering spectrometry (RBS) and hydrogen forward scattering (HFS), preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

"Silicon oxynitride" contains more oxygen than nitrogen and in the case where measurements are performed using RBS and HFS, preferably contains oxygen, nitrogen, silicon, and hydrogen at 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

The semiconductor film 110 may be a single layer or a stacked-layer of plural layers as long as it is a semiconductor film(s). As the semiconductor film 110, for example, an oxide semiconductor film or a silicon film can be used.

When the semiconductor film 110 is an oxide semiconductor film, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Ga-based oxide semiconductor, or an In—Mg-based oxide semiconductor; an In-based oxide semiconductor, a Sn-based oxide semiconductor, or a Zn-based oxide semiconductor; or the like can be used. Such an oxide semiconductor film can contain $SiO_2$. For example, an In—Ga—Zn-based oxide semiconductor film may be an oxide semiconductor film having In, Ga, or Zn, regardless of its stoichiometry ratio. Further, the In—Ga—Zn-based oxide semiconductor film may contain an element other than In, Ga, and Zn.

When an oxide semiconductor film is used for the semiconductor film 110, an oxide semiconductor film represented by the chemical formula, $InMO_3(ZnO)_m$ (m>0) can also be used for example. Here, M represents one or more metal elements selected from the group of Ga, Al, Mn, and Co. For example, M can be Ga, Ga and Al, Ga and Mn, or Ga and Co. In addition, the oxide semiconductor film may include $SiO_2$.

A target used for the formation of the oxide semiconductor film by a sputtering method was, for example, an oxide target containing $In_2O_3$, $Ga_2O_3$, and ZnO at a composition ratio of 1:1:1 [molar ratio]. However, without being limited to the material and the composition ratio, for example, an oxide semiconductor target containing $In_2O_3$, $Ga_2O_3$, and ZnO at a composition ratio of 1:1:2 [molar ratio] may be used.

Here, in a case where the semiconductor film 110 is an oxide semiconductor film formed by a sputtering method, the semiconductor film 110 can be formed by the sputtering method under a rare gas (for example Ar) atmosphere, an oxygen atmosphere, or a mixed atmosphere of a rare gas and oxygen.

The filling rate of the oxide target is 90% to 100%, preferably 95% to 99.9%. With use of the target having a high filling factor, the oxide semiconductor film to be formed can be a dense film.

Alternatively, a silicon film may be formed as the semiconductor film 110. The silicon film may be an amorphous silicon film. Alternatively, the semiconductor film 110 may be a stacked-layer silicon film in which a silicon film with low carrier mobility is stacked over a silicon film with high carrier mobility.

An example of the silicon film with high carrier mobility is a crystalline silicon film, and an example of the crystalline silicon is microcrystalline silicon. Note that microcrystalline silicon is a semiconductor having an intermediate structure between an amorphous structure and a crystalline structure (including single crystal and polycrystal). Microcrystalline silicon is silicon having a third state that is stable in terms of free energy and is crystalline silicon having short-range order and lattice distortion, in which column-like or needle-like crystal grains having a diameter of 2 nm to 200 nm, preferably 10 nm to 80 nm, more preferably 20 nm to 50 nm grow in a direction normal to the substrate surface. Thus, there is a case where grain boundaries are formed at the interface of the columnar or needle-like crystal grains. It is to be noted that the crystal grain size means the maximum diameter of a crystal grain in a plane parallel to the substrate surface. Further, the crystal grain includes an amorphous silicon region and a crystallite which is a minute crystal that can be regarded as a single crystal. It is to be noted that the crystal grains may include a twin crystal in some cases.

Microcrystalline silicon, which is one of microcrystalline semiconductors, has a peak of Raman spectrum which is shifted to a lower wave number side than 520 $cm^{-1}$ that features single crystal silicon. More specifically, the Raman spectrum peak of the microcrystalline silicon lies between the wave number of 520 cm$^{-1}$ that features single crystalline silicon and the wave number of 480 cm$^{-1}$ that features amorphous silicon. The microcrystalline silicon may contain hydrogen or halogen of at least 1 at. % to terminate dangling bonds. Furthermore, the microcrystalline silicon contains a rare gas element such as He, Ar, Kr, or Ne to further promote lattice distortion, so that stability is increased and favorable microcrystalline silicon can be obtained.

The silicon film with low carrier mobility may be an amorphous silicon film, preferably a silicon film which includes amorphous silicon and grains of micro-crystalline silicon and has lower energy at an Urbach edge measured by a constant photocurrent method (CPM) or photoluminescence spectroscopy and a smaller amount of defect-induced absorption spectrum, as compared with conventional amorphous silicon films. This silicon film is a well-ordered silicon film which has fewer defects and has a level with a steeper tail slope at the band edge (mobility edge) of the valence band, as compared with conventional amorphous silicon films.

The silicon film with low carrier mobility may contain a halogen element or nitrogen. In the case of containing nitrogen, the silicon film with low carrier mobility may contain nitrogen as a NH group or a NH$_2$ group.

Note that an interface region between the silicon film with high carrier mobility and the silicon film with low carrier mobility includes microcrystalline semiconductor regions and amorphous semiconductor regions among the microcrystalline semiconductor regions. Specifically, the interface region includes a microcrystalline semiconductor region which grows in a conical or pyramidal shape from the silicon film with high carrier mobility, and a region including amorphous semiconductor similar to the silicon film with low carrier mobility.

When the silicon film with low carrier mobility is provided between the source and drain electrodes and the silicon film with high carrier mobility, off-state current of the transistor can be reduced. Further, since the interface region has the microcrystalline silicon region which extends in a conical or pyramidal shape, resistance in the vertical direction (the direction in which the film grows) can be lowered and on-state current of the transistor can be increased. In other words, as compared to the case of using conventional amorphous silicon, the off-state current can be sufficiently reduced and reduction in on-state current can be inhibited; thus, switching characteristics of the transistor can be enhanced.

Note that the microcrystalline silicon region grows from a surface of the silicon film with high carrier mobility in the film thickness direction. When the flow rate of hydrogen to that of a deposition gas (e.g., silane) in a source gas is low (that is, the dilution ratio is low) or when the concentration of a source gas containing nitrogen is high, crystal growth in the microcrystalline silicon region is suppressed, and thus, crystal grains come to have a conical or pyramidal shape, and a large portion of the deposited silicon is amorphous.

As the second etching mask 112, for example, a resist mask may be formed; however, there is no particular limitation on the second etching mask 112, and any material that can be used as a mask in an etching step can be used.

Figure 1D:
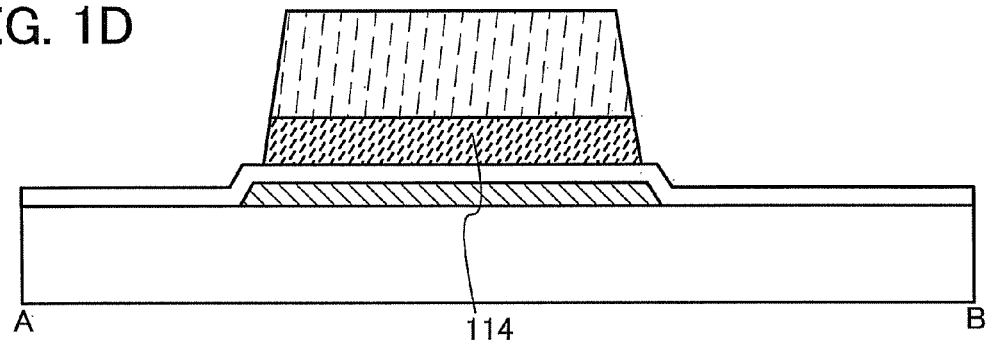

Then, with use of the second etching mask 112, the semiconductor film 110 is processed so that the semiconductor layer 114 is formed (FIG. 1D).

Figure 2A:
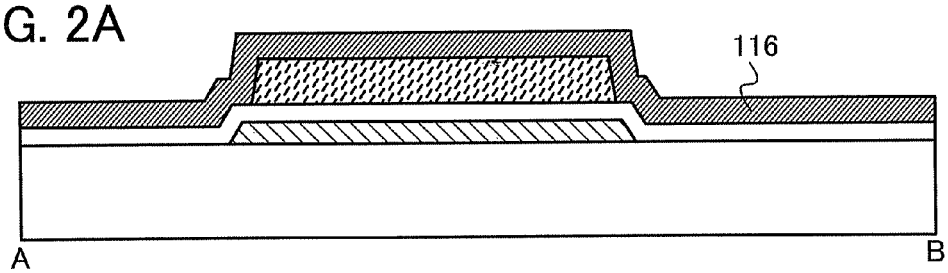
FIGS. 2A to 2D illustrate a fabrication method of a pixel transistor according to one embodiment of the present invention.

Then, the second etching mask 112 is removed, and a transparent conductive film 116 is formed to cover the semiconductor layer 114 over the gate insulating layer 108 (FIG. 2A).

The transparent conductive film 116 can be formed using a conductive composition including a conductive high molecule (also referred to as a conductive polymer) having a light-transmitting property. It is preferred that the transparent conductive film 116 formed using the conductive composition has a sheet resistance of 10000 W/square or less and a light transmittance of 70% or higher at a wavelength of 550 nm. Further, the resistivity of the conductive high molecule included in the conductive composition is preferably 0.1 Ω·cm or lower.

Figure 2B:
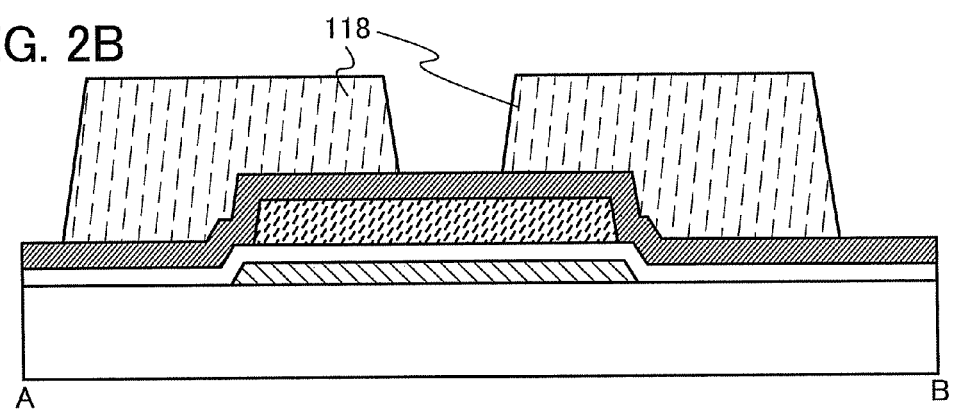

Next, a third etching mask 118 is formed over the transparent conductive film 116 (FIG. 2B).

As the third etching mask 118, for example, a resist mask may be formed; however, there is no particular limitation on the third etching mask 118, and any material that can be used as a mask in an etching step can be used.

Figure 2C:
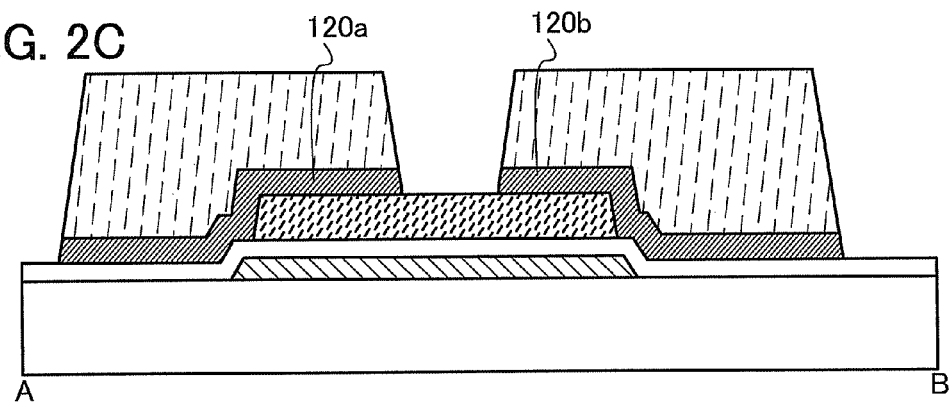

Next, the transparent conductive film 116 is processed using the third etching mask 118 so that an electrode 120a also serving as a signal line and an electrode 120b also serving as a pixel electrode are formed (FIG. 2C).

Figure 2D:
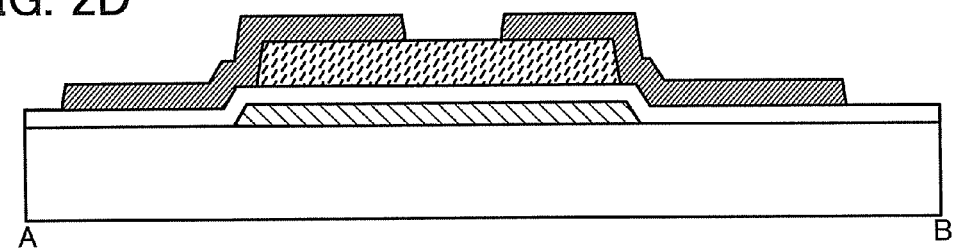

After that, the third etching mask 118 is removed (FIG. 2D).

After that, preferably, an upper portion of the semiconductor layer 114 is etched so that residue or the like left between the electrode 120a also serving as a signal line and the electrode 120b also serving as a pixel electrode is removed and thereby the electrodes are completely insulated.

In the above-described manner, the pixel transistor can be fabricated. A top view of the pixel transistor is illustrated in FIG. 3. In the pixel transistor in this embodiment, a contact resistance is not generated between the drain electrode (or the source electrode) and the pixel electrode, because the drain electrode (or the source electrode) also serves as the pixel electrode.

In addition, in accordance with the fabrication method of a pixel transistor in this embodiment, the number of masks can be reduced as compared with that in a conventional method. Specifically, a pixel transistor can be fabricated with use of three masks.

Figure 4A:
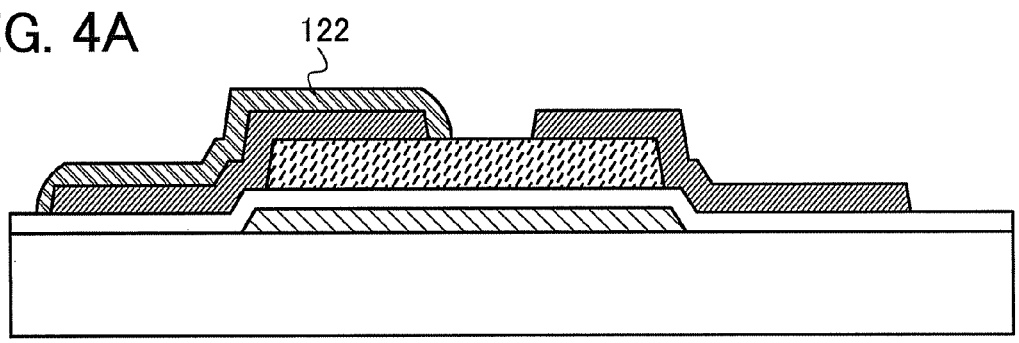
FIGS. 4A and 4B illustrate a fabrication method of a pixel transistor according to one embodiment of the present invention.

Note that over the electrode 120a also serving as a signal line, a low resistant conductive layer 122 is preferably provided (FIG. 4A). The low resistant conductive layer 122 formed over the electrode 120a also serving as a signal line is preferably formed without increasing the number of masks. In order to form the low resistant conductive layer 122 over the electrode 120a also serving as a signal line without increasing the number of masks, a metal layer is preferably formed by an electroplating method.

In other words, the substrate 100 provided with the pixel transistor illustrated in FIG. 2D and an anode formed of a metal to be used for plating or an insoluble metal are immersed in an electrolyte solution including ions of the metal to be used for plating, and thus a potential difference is generated between the anode and the electrode 120a also serving as a signal line so that cations are reduced on the surface of the electrode 120a also serving as a signal line and thus a metal layer is formed.

Here, preferred examples of the metal to be used for plating include, but not limited to, silver, gold, and platinum, which are metals having low electric resistances and low ionization tendencies.

Figure 4B:
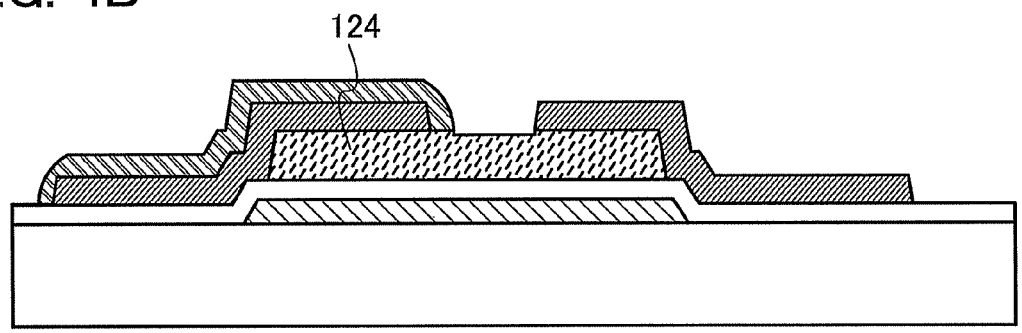

After that, preferably, an upper portion of the semiconductor layer 114 is etched so that residue or the like left between the electrode 120a also serving as a signal line and the electrode 120b also serving as a pixel electrode is removed to make complete insulation, and then the semiconductor layer 124 is formed (FIG. 4B).

Figure 5:
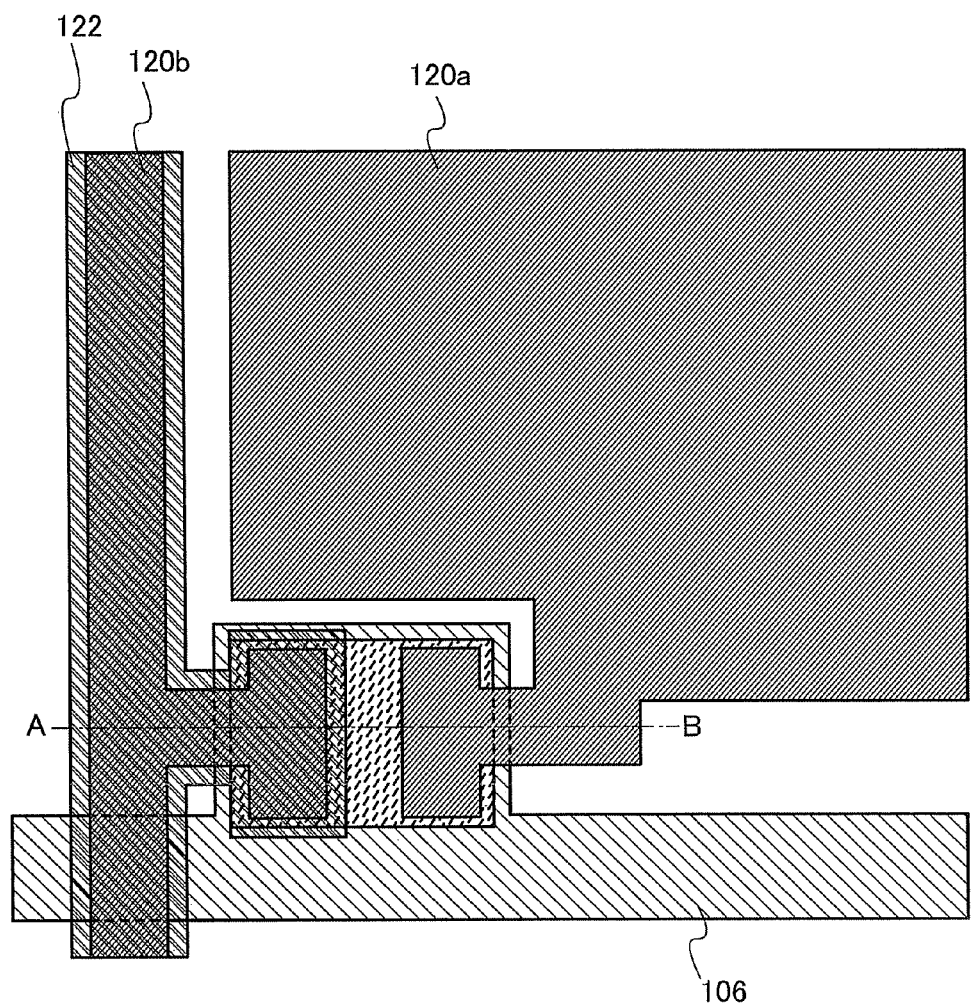
FIG. 5 illustrates a pixel transistor according to one embodiment of the present invention.

FIG. 5 illustrates a top view of the pixel transistor fabricated in this manner. In the pixel transistor illustrated in FIG.

5, wiring resistance is lowered due to the low resistant conductive layer and no contact resistance is generated between the drain electrode (or the source electrode) and the pixel electrode. According to this embodiment, such a display device can be manufactured with the small number of masks.

Embodiment 2

The first etching mask 104 and the second etching mask 112 in Embodiment 1 can be formed using the same photomask. Therefore, the number of photomasks can be smaller than that in Embodiment 1. In this embodiment, a manufacturing method of a display device with the smaller number of photomasks than that in Embodiment 1 will be described with reference to FIGS. 6A and 6B, FIGS. 7A and 7B, FIGS. 8A and 8B, FIGS. 9A and 9B, and FIGS. 10A and 10B.

Note that FIG. 6A, FIG. 7A, FIG. 8A, FIG. 9A, and FIG. 10A are top views, while FIG. 6B, FIG. 7B, FIG. 8B, FIG. 9B, FIG. 10B are cross-sectional views taken along the lines A-B in FIG. 6A, FIG. 7A, FIG. 8A, FIG. 9A, and FIG. 10A.

Figure 6A:
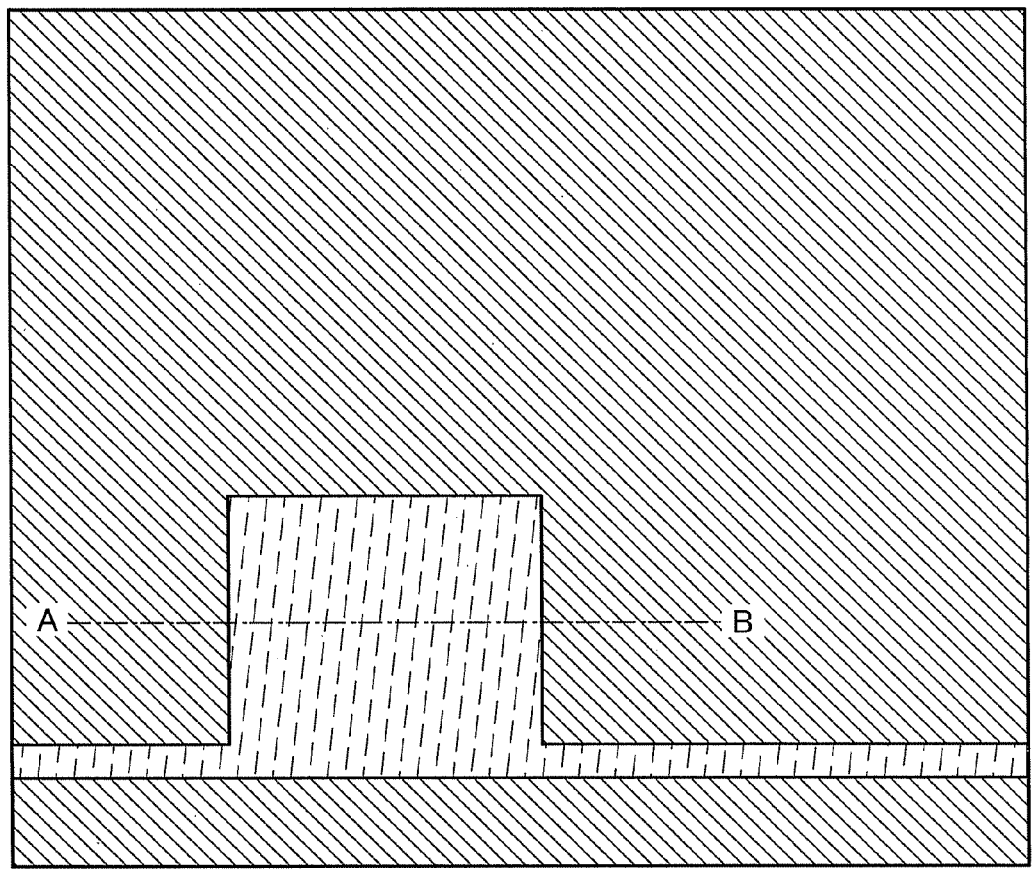
FIGS. 6A and 6B illustrate a fabrication method of a pixel transistor according to one embodiment of the present invention.
Figure 6B:
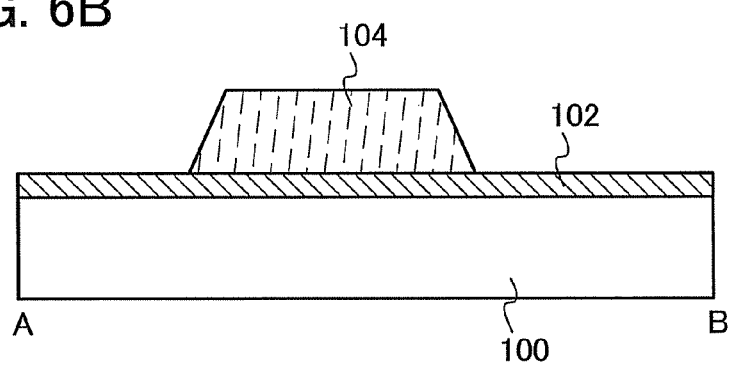

In a manner similar to that in Embodiment 1, the first conductive film 102 is formed over the substrate 100, and the first etching mask 104 is formed over the first conductive film 102 (FIGS. 6A and 6B).

Figure 7A:
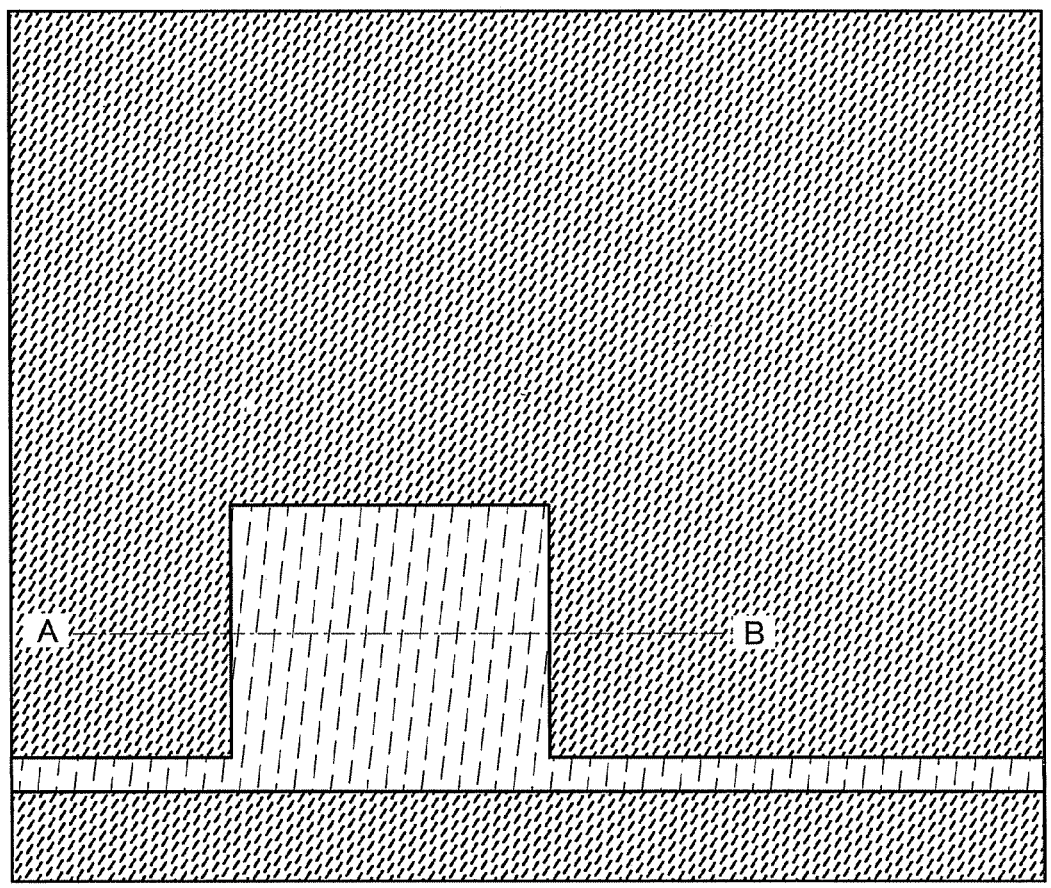
FIGS. 7A and 7B illustrate a fabrication method of a pixel transistor according to one embodiment of the present invention.
Figure 7B:
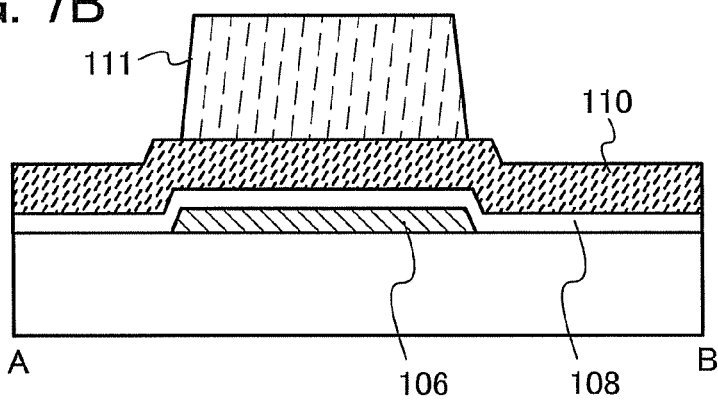

Next, with use of the first etching mask 104, the first conductive film 102 is processed so that the gate electrode 106 is formed, the first etching mask 104 is removed, the gate insulating layer 108 is formed to cover the gate electrode 106, the semiconductor film 110 is formed over the gate insulating layer 108, and a second etching mask precursor 111 is formed over the semiconductor film 110 (FIGS. 7A and 7B).

Here, the second etching mask precursor 111 is formed with use of the same photomask as the first etching mask 104.

Figure 8A:
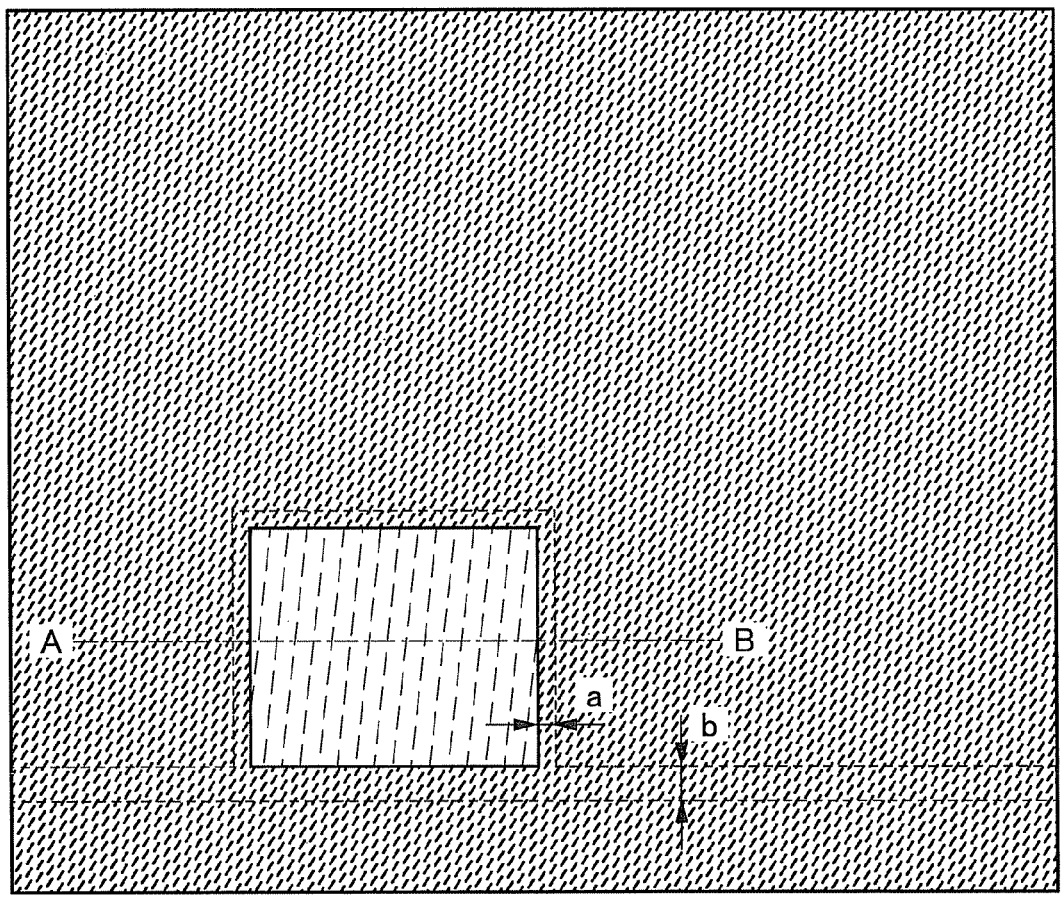
FIGS. 8A and 8B illustrate a fabrication method of a pixel transistor according to one embodiment of the present invention.
Figure 8B:
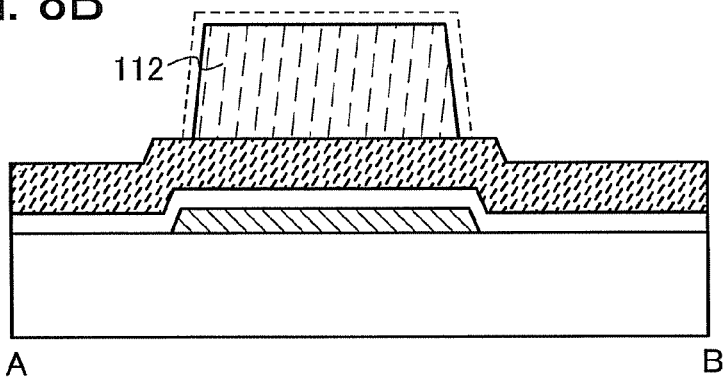

Next, the second etching mask precursor 111 is scaled down so that the second etching mask 112 is formed (FIGS. 8A and 8B). For scaling down the second etching mask precursor 111, an aching process may be performed for example.

Here, the second etching mask 112 is formed to be island-shaped. That is, the second etching mask precursor 111 is scaled down so that the second etching mask 112 can have an island shape. At this time, in the case where the width of an ashed portion of the second etching mask precursor 111 is "a" and the width of a scan line formed of the gate electrode 106 is "b", it is only necessary that the b may be smaller than 2a.

That is, in this embodiment, the relation, b<2a should be fulfilled. However, when the width of the scan line is too narrow, defective formation might occur, so that ample current is difficult to flow. For that reason, the width b of the scan line is preferably larger than the width a. Accordingly, it is much preferable that the relation a<b<2a is fulfilled.

Figure 9A:
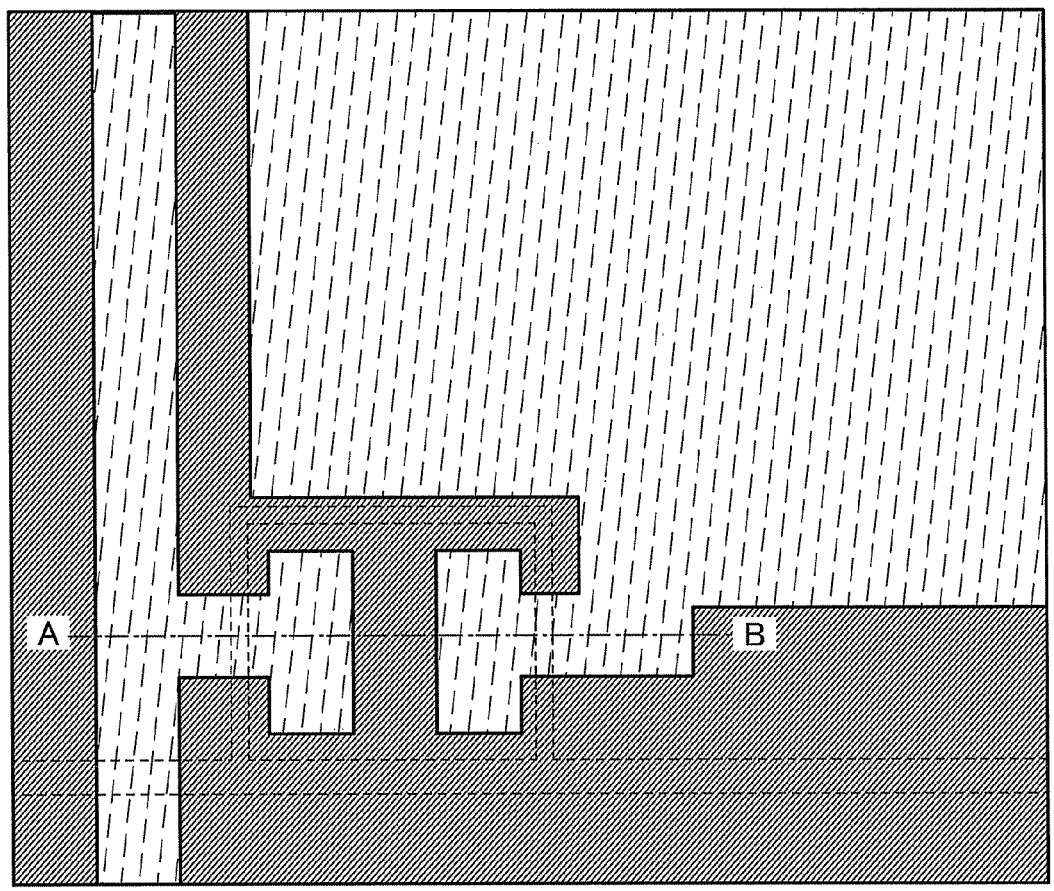
FIGS. 9A and 9B illustrate a fabrication method of a pixel transistor according to one embodiment of the present invention.
Figure 9B:
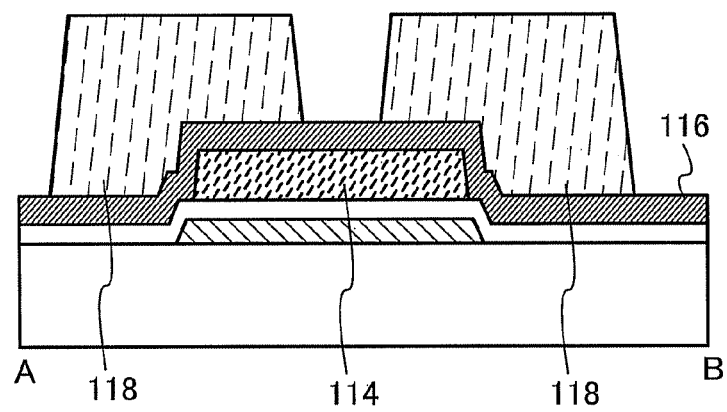

Next, the semiconductor film 110 is processed with use of the second etching mask 112 so that the semiconductor layer 114 is formed, the second etching mask 112 is removed, the transparent conductive film 116 is formed to cover the semiconductor layer 114 over the gate insulating layer 108, and the third etching mask 118 is formed over the transparent conductive film 116 (FIGS. 9A and 9B).

Figure 10A:
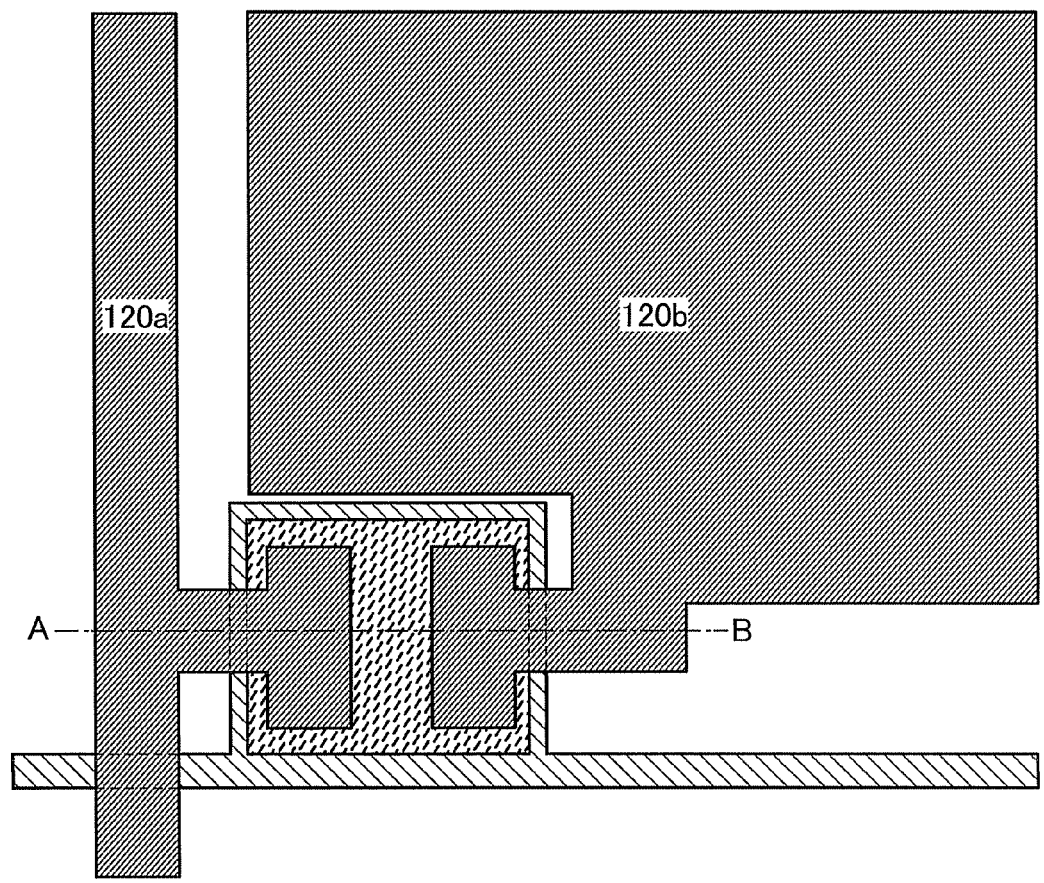
FIGS. 10A and 10B illustrate a fabrication method of a pixel transistor according to one embodiment of the present invention.
Figure 10B:
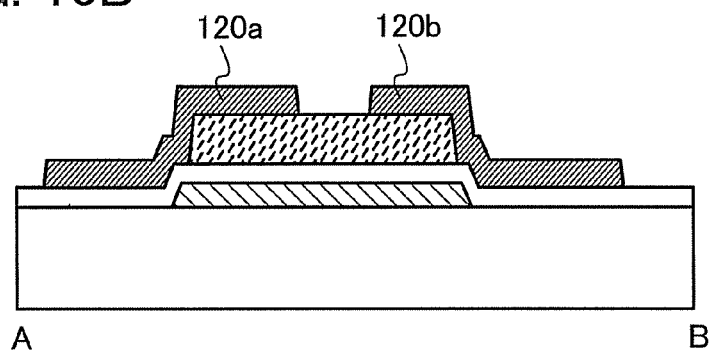

With use of the third etching mask 118, the transparent conductive film 116 is processed so that the electrode 120a also serving as a signal line and the electrode 120b also serving as a pixel electrode are formed, and then the third etching mask 118 is removed (FIGS. 10A and 10B).

After that, preferably, the low resistant conductive layer 122 is formed as in Embodiment 1.

As described in this embodiment, the pixel transistor can be fabricated with two photomasks.

Embodiment 3

When the pixel transistor in which the low resistant conductive layer is formed over the electrode also serving as a signal line is formed, as the preferred embodiments described in Embodiment 1 and Embodiment 2, it is difficult to make the channel lengths within the substrate uniform. Therefore, in this embodiment, an embodiment in which a sidewall insulating layer is provided for the electrode also serving as a signal line and the electrode also serving as a pixel electrode will be described. When a sidewall insulating layer is provided for the electrode also serving as a signal line and the electrode also serving as a pixel electrode, the distance (channel length L) between the electrode also serving as a signal line and the electrode also serving as a pixel electrode can be determined at the time of processing of the transparent conductive film, so that the channel lengths L can be prevented from varying from point to point within the substrate. Accordingly, display unevenness (mura) of a display device can be prevented.

First, in a manner similar to that in Embodiment 1, elements up to and including the electrode 120a also serving as a signal line and the electrode 120b also serving as a pixel electrode are formed.

Figure 11A:
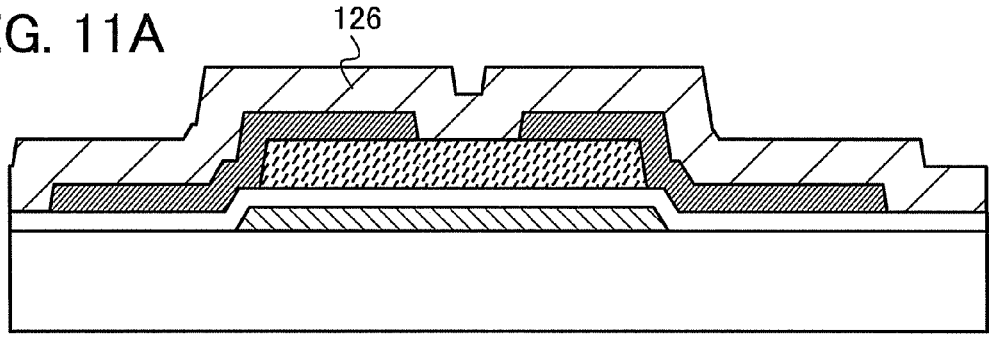
FIGS. 11A to 11D illustrate a fabrication method of a pixel transistor according to one embodiment of the present invention.

Then, after the third etching mask 118 is removed, a sidewall insulating film 126 is formed over the gate insulating layer 108, the semiconductor layer 114, the electrode 120a also serving as a signal line and the electrode 120b also serving as a pixel electrode (FIG. 11A).

The sidewall insulating film 126 can be formed of an insulating film (for example, silicon nitride, silicon nitride oxide, silicon oxynitride, silicon oxide, or the like) by, for example, a sputtering method or a CVD method (including a plasma CVD method, a thermal CVD method, and the like). Note that the sidewall insulating film 126 may be formed to have a single layer structure or a stacked structure including a plurality of layers.

Figure 11B:
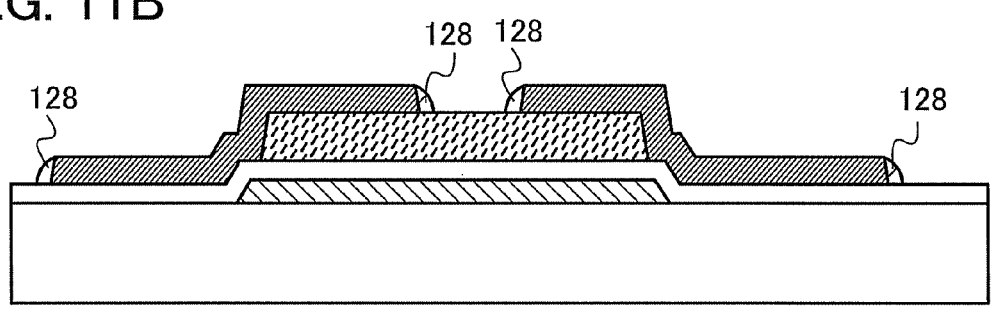

Next, a sidewall insulating layer 128 is formed by performing etch-back treatment so as to expose the electrode 120a also serving as a signal line and the electrode 120b also serving as a pixel electrode (FIG. 11B).

Figure 11C:
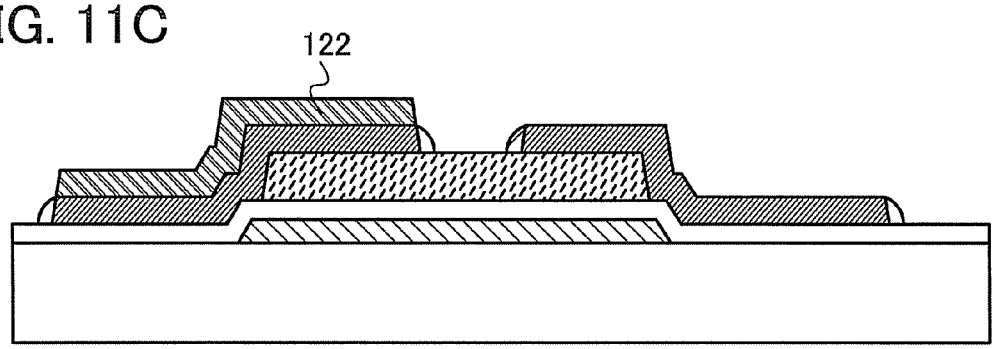

Next, the low resistant conductive layer 122 is formed over the electrode 120a also serving as a signal line by an electroplating method (FIG. 11C).

As described above, a sidewall insulating layer can be formed on the electrode 120a also serving as a signal line and the electrode 120b also serving as a pixel electrode. In this manner, the provision of the sidewall insulating layer for the electrode 120a also serving as a signal line and the electrode 120b also serving as a pixel electrode can determine the distance (channel length L) between the electrode 120a also serving as a signal line and the electrode 120b also serving as a pixel electrode at the time of processing the transparent conductive film 116, irrespective of formation of the low resistant conductive layer 122 so that the channel lengths L can be prevented from varying from point to point within the substrate. Therefore, display unevenness (mura) of the display device can be prevented.

Figure 11D:
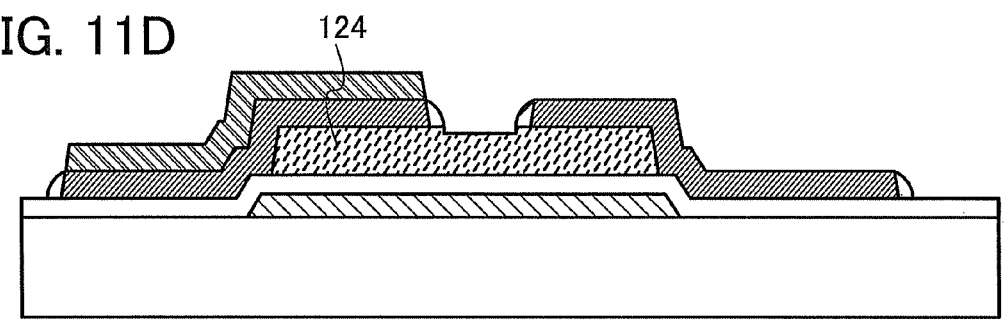

After that, preferably, an upper portion of the semiconductor layer 114 is etched so that residue or the like left between the electrode 120a also serving as a signal line and the electrode 120b also serving as a pixel electrode is removed to make complete insulation and then the semiconductor layer 124 is formed (FIG. 11D).

Embodiment 4

In Embodiment 1, as the method of forming the low resistant conductive layer 122 without increasing the number of masks, an electroplating method is exemplified. However, the method is not a limiting example, and another method can be employed to faun the low resistant conductive layer 122. In this embodiment, a lift-off process is used as the method.

Note that the term "lift-off" process means such a process that in order to make a desired pattern, a protective mask with the desired pattern is formed, a film to be provided with the desired pattern is formed, and then the protective mask is removed, so that the desired pattern is formed in a portion which have not been provided with the protective mask.

Figure 12A:
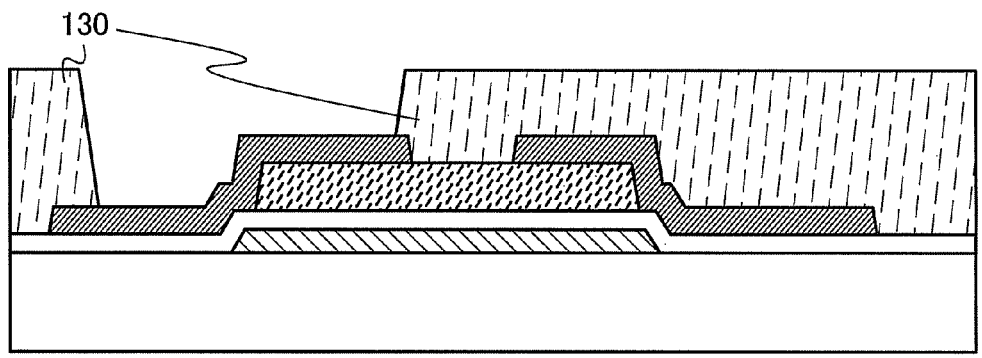
FIGS. 12A to 12D illustrate a fabrication method of a pixel transistor according to one embodiment of the present invention.

First, in a manner similar to that in Embodiment 1, elements up to and including the electrode 120a also serving as a signal line and the electrode 120b also serving as a pixel electrode are formed. Then, a protective mask 130 is formed in a portion excluding the portion where the low resistant conductive layer 122 is formed (FIG. 12A). At this time, the protective mask 130 may be formed of a resist material, for example.

Figure 12B:
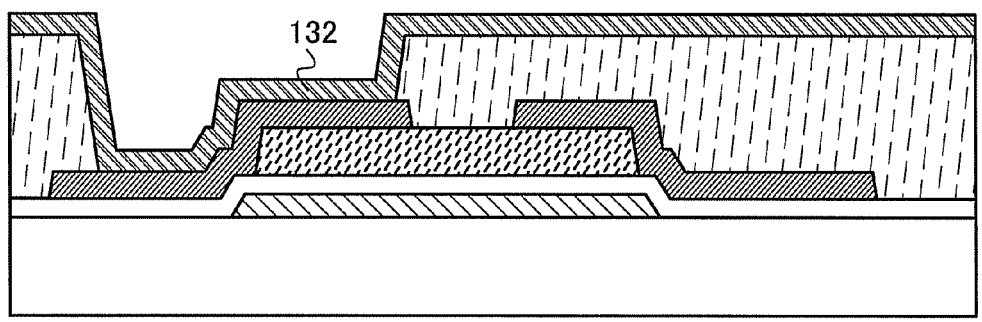

Next, a low resistant conductive film 132 for formation of the low resistant conductive layer 122 is formed (FIG. 12B). At this time, the low resistant conductive film 132 is formed entirely and thus is formed also over the protective mask 130.

Figure 12C:
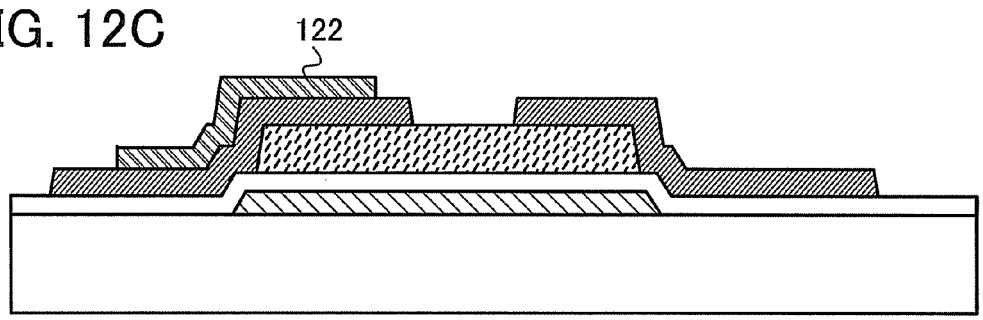

Next, the lift-off process is performed to remove the protective mask 130. By the removal of the protective mask 130, the low resistant conductive film 132 over the protective mask 130 is also removed, so that the low resistant conductive layer 122 in a desired region is formed (FIG. 12C).

Figure 12D:
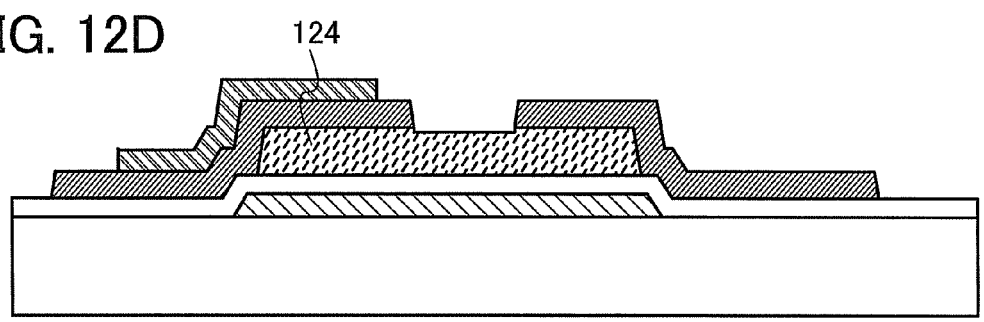

After that, preferably, an upper portion of the semiconductor layer 114 is etched to remove the residue or the like left between the electrode 120a also serving as a signal line and the electrode 120b serving as the pixel electrode to make complete insulation, and then the semiconductor layer 124 is formed (FIG. 12D).

As described above, the low resistant conductive layer 122 can be formed without increasing the number of masks such as photomasks and etching masks and without performing an electroplating method. It is noted that by the lift-off process, a minute pattern of about 2 μm or less is difficult to be formed. However, for example, the width of a signal line of a large-screen liquid crystal display device using amorphous semiconductor is about 3 μm or more, and as described in this embodiment, the low resistant conductive layer 122 is formed only in the portion of the signal line, not necessarily in the electrode portion. Therefore, the difficulty in miniaturization of the lift-off process does not matter.

The lift-off process described in this embodiment can be applied to the fabrication methods of the pixel transistors described in Embodiment 2 and Embodiment 3.

Embodiment 5

In Embodiment 1 and Embodiment 4, the lift-off process and the electroplating method are exemplified as the method of forming the low resistant conductive layer 122 without increasing the number of masks such as photomasks and etching masks. However, the methods are not limiting examples, and another method can be employed to form the low resistant conductive layer 122. In this embodiment, a droplet-discharge method is used as the method.

Note that the "droplet-discharge method" means such a method that a droplet of a composition for forming a desired layer is selectively dropped or injected so that the desired pattern is formed. An inkjet method is included in the category of the droplet-discharge method.

Figure 13A:
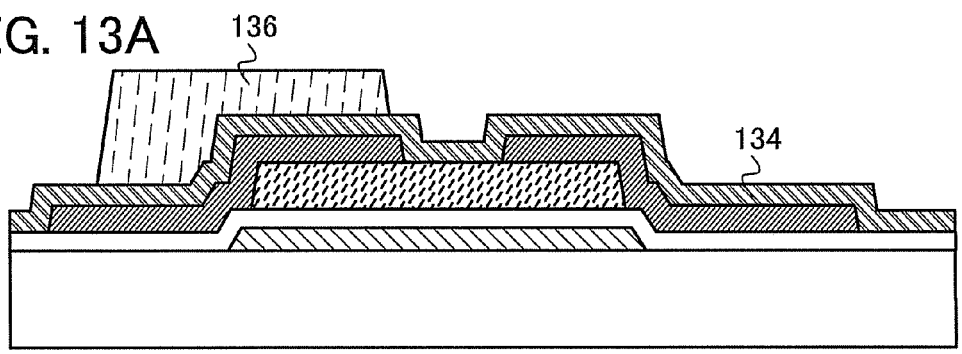
FIGS. 13A to 13D illustrate a fabrication method of a pixel transistor according to one embodiment of the present invention.

First, in a manner similar to that in Embodiment 1, elements up to and including the electrode 120a also serving as a signal line and the electrode 120b also serving as a pixel electrode are formed. Then, a low resistant conductive film 134 is formed, a fourth etching mask 136 is formed over the low resistant conductive film 134 by a droplet-discharge method (FIG. 13A). At this time, the fourth etching mask 136 can be formed of a resist material for example.

Figure 13B:
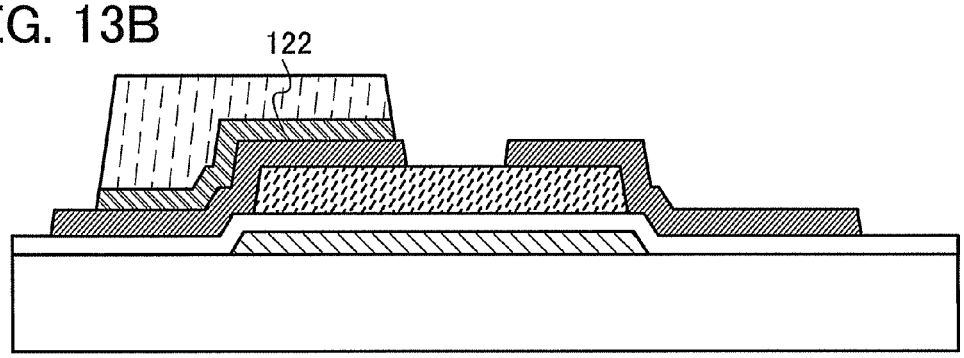
Figure 13C:
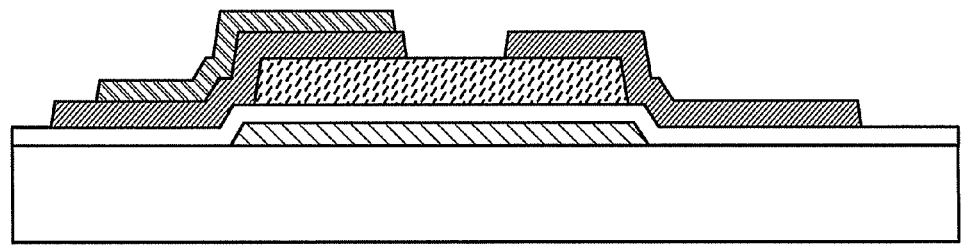

Next, with use of the fourth etching mask 136, the low resistant conductive film 134 is etched so that the low resistant conductive layer 122 is formed (FIG. 13B). Then, the fourth etching mask 136 is removed (FIG. 13C).

Figure 13D:
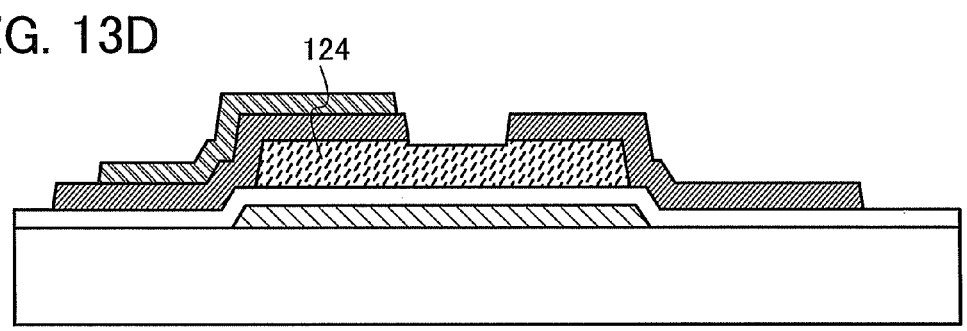

After that, preferably, an upper portion of the semiconductor layer 114 is etched to remove the residue or the like left between the electrode 120a also serving as a signal line and the electrode 120b serving as the pixel electrode to make complete insulation, and then the semiconductor layer 124 is formed (FIG. 13D).

As described above, the low resistant conductive layer 122 can be formed without increasing the number of photomasks and without performing an electroplating method or a lift-off process. It is noted that by the droplet-discharge method, a minute pattern of about 2 μm or less is difficult to be formed. However, for example, the width of a signal line of a large-screen liquid crystal display device using amorphous semiconductor is about 3 μm or more, and as described in this embodiment, the low resistant conductive layer 122 is formed only in the portion of the signal line, not necessarily in the electrode portion. Therefore, the difficulty in miniaturization of the droplet-discharge method does not matter.

Note that one embodiment of the present invention, described in this embodiment, is not limited to the description made above, and the low resistant conductive layer 122 itself may be formed by a droplet-discharge method.

Note that the droplet-discharge method described in this embodiment may be applied to the fabrication methods of the pixel transistors described in Embodiment 2 and Embodiment 3.

The droplet-discharge method described in this embodiment can be combined with the lift-off process described in Embodiment 4. In other words, the protective mask 130 in Embodiment 4 can be formed by a droplet-discharge method.

Embodiment 6

As described in Embodiment 1, when the low resistant conductive layer 122 is formed over the electrode 120a also serving as a signal line by an electroplating method, the potentials of the electrodes 120a also serving as a signal line are preferably equal for electroplating so that the low resistant conductive layer 122 can be formed uniformly over the substrate. In this embodiment described is a production system of a display device in which electroplating is conducted with the equal potentials of the electrodes 120a also serving as a signal line.

First, in a manner similar to that in Embodiment 1, elements up to and including the electrode 120a also serving as a signal line and the electrode 120b also serving as a pixel electrode are formed.

Figure 14A:
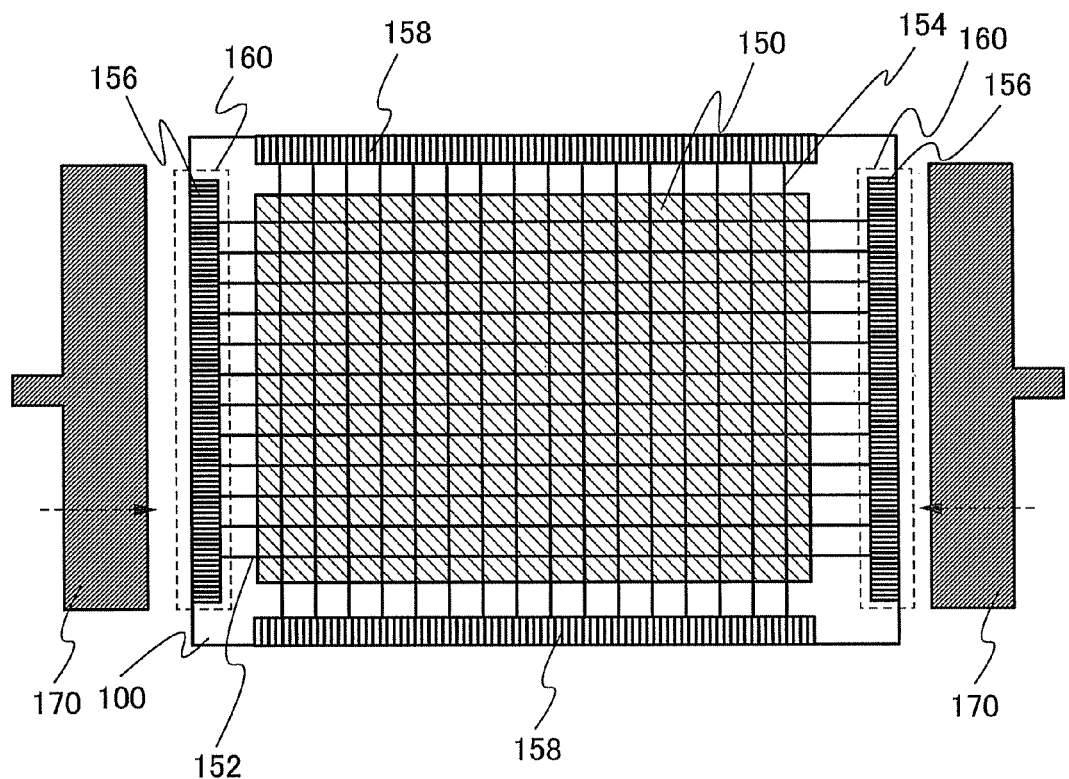
FIGS. 14A and 14B illustrate a production system of a display device according to one embodiment of the present invention.

FIG. 14A is a schematic diagram of the substrate 100 where elements up to and including the electrode 120a also serving as a signal line and the electrode 120b also serving as a pixel electrode are formed as described in Embodiment 1. Over the substrate 100, a plurality of pixels 150 are formed in matrix. In addition, each input terminal supplies a signal or a power potential to the pixels 150.

The plurality of pixels 150 are each connected to a signal line 152 and a scan line 154, and a signal line side input terminal 156 and a scan line side input terminal 158 which supply signals or power potentials are formed in the outer periphery of the substrate 100.

An upper arm 170 and a lower arm 172 used to transport the substrate 100 are disposed so as to hold the signal line side input terminal 156 of the substrate 100 in a region 160. The upper arm 170 and the lower arm 172 may hold one signal line side input terminal 156 over the substrate 100, or hold both of the signal line side input terminals 156 provided on the opposite sides.

Figure 14B:
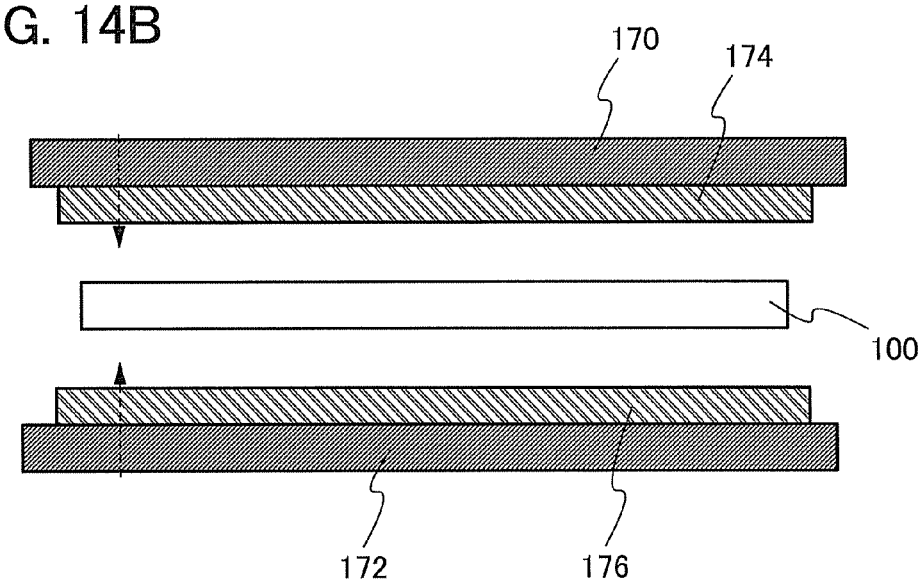

FIG. 14B illustrates where the upper arm 170, the lower arm 172, and the substrate 100 in FIG. 14A are positioned. As illustrated in FIG. 14B, the upper arm 170 and the lower arm 172 hold the substrate 100. A conductive portion 174 and a conductive portion 176 are provided for the upper arm 170 and the lower arm 172 respectively, and the conductive portion 174 or the conductive portion 176 is connected to the signal line side input terminal 156.

The substrate 100 held by the upper arm 170 and the lower arm 172 is immersed in an electrolyte solution containing ions of a metal to be used for plating together with the anode formed of the metal to be used for plating or an insoluble metal. When the substrate 100 is immersed in the electrolyte solution, a potential difference is made to be produced between the anode and the conductive portion 174 or the conductive portion 176, and thereby cations are reduced on the surface of the electrode 120a also serving as a signal line so that the low resistant conductive layer is formed.

In the above-described manner, an active matrix substrate of a display device including the pixel transistor described in Embodiment 1 can be manufactured. Note that with use of a production system of this embodiment, an active matrix substrate of a display device including the pixel transistor described in Embodiment 2 can be manufactured as well.

Embodiment 7

Electronic paper can be given as an example of a semiconductor device to which the pixel transistor fabricated in the above-described manner is applied. Electronic paper can be used for electronic devices of a variety of fields for displaying information. For example, electronic paper can be applied to e-book readers (e-books), posters, digital signage, public information displays (PID), advertisements in vehicles such as trains, displays of various cards such as credit cards, and the like. An example of an electronic device is illustrated in FIG. 15.

Figure 15:
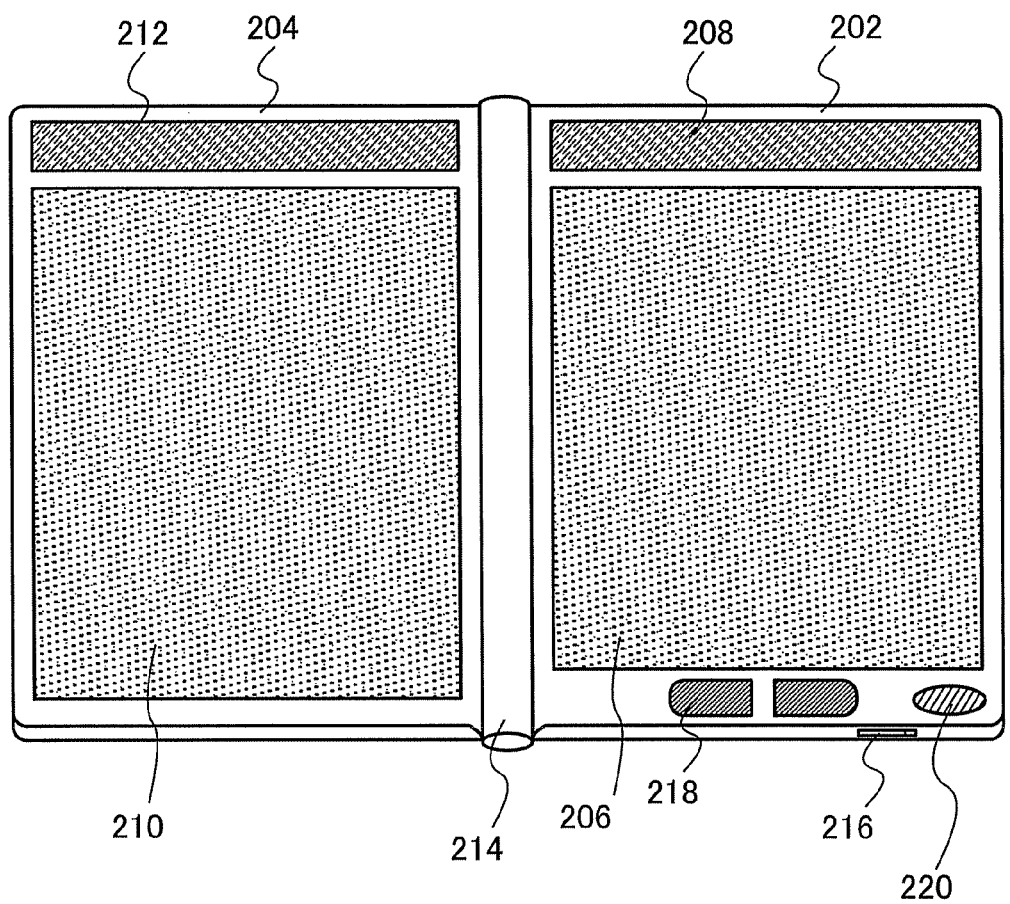
FIG. 15 illustrates a semiconductor device to which a display device of one embodiment of the present invention is applied.

FIG. 15 illustrates an example of an e-book reader. For example, an e-book reader 200 includes two housings 202 and 204. The housing 202 and the housing 204 are unified with a hinge 214 so that the e-book reader 200 can be opened and closed with the hinge 214 as an axis. With such a structure, the e-book reader 200 can be handled like a paper book.

A display portion 206 and a photoelectric conversion device 208 are incorporated in the housing 202. A display portion 210 and a photoelectric conversion device 212 are incorporated in the housing 204. The display portion 206 and the display portion 210 may be configured to display one image or different images. When different images are displayed, for example, text can be displayed on the right display portion (the display portion 206 in FIG. 15) and images can be displayed on the left display portion (the display portion 210 in FIG. 15).

FIG. 15 illustrates the example in which the housing 202 is provided with an operation portion and the like. For example, the housing 202 is provided with a power switch 216, operation keys 218, a speaker 220, and the like. Pages can be turned with the operation keys 218. Note that a keyboard, a pointing device, or the like may also be provided on the surface of the housing, on which the display portion is provided. Further, an external connection terminal (an earphone terminal, a USB terminal, a terminal connectable to an AC adapter or a variety of cables such as a USB cable, or the like), a recording medium insertion portion, and the like may be provided on the back surface or the side surface of the housing. Furthermore, the e-book reader 200 may have a function of an electronic dictionary.

The e-book reader 200 may have a configuration capable of wirelessly transmitting and receiving data. Through wireless communication, desired book data or the like can be purchased and downloaded from an electronic book server.

Embodiment 8

Further, as semiconductor devices to which the pixel transistor formed as described above is applied, a variety of electronic devices (including an amusement machine) can be given in addition to electronic paper. Examples of electronic devices are television devices (also referred to as televisions or television receivers), monitors of computers and the like, cameras such as digital cameras or digital video cameras, digital photo frames, mobile phones (also referred to as cellular phones or mobile phone devices), portable game consoles, personal digital assistants, audio reproducing devices, large-sized game machines such as pachinko machines, and the like.

Figure 16A:
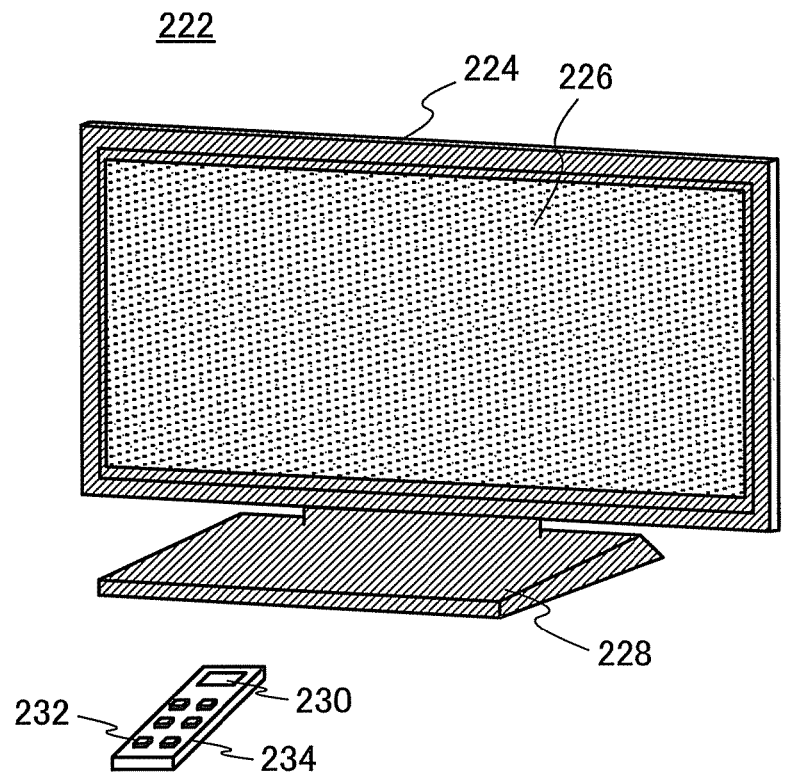
FIGS. 16A and 16B each illustrate a semiconductor device to which a display device of one embodiment of the present invention is applied.

FIG. 16A illustrates an example of a television device. In a television set 222, a display portion 226 is incorporated in a housing 224. The display portion 226 can display images. Further, the housing 224 is supported by a stand 228 here.

The television device 222 can be operated by an operation switch of the housing 224 or a separate remote controller 234. Channels and volume can be controlled by an operation key 232 of the remote controller 234, so that an image displayed on the display portion 226 can be manipulated. Further, the remote controller 234 may be provided with a display portion 230 which displays data output from the remote controller 234.

Note that the television set 222 is provided with a receiver, a modem, and the like. With the use of the receiver, general television broadcasting can be received. Moreover, when the television set 222 is connected to a communication network with or without wires via the modem, one-way (from a sender to a receiver) or two-way (between a sender and a receiver or between receivers) information communication can be performed.

Figure 16B:
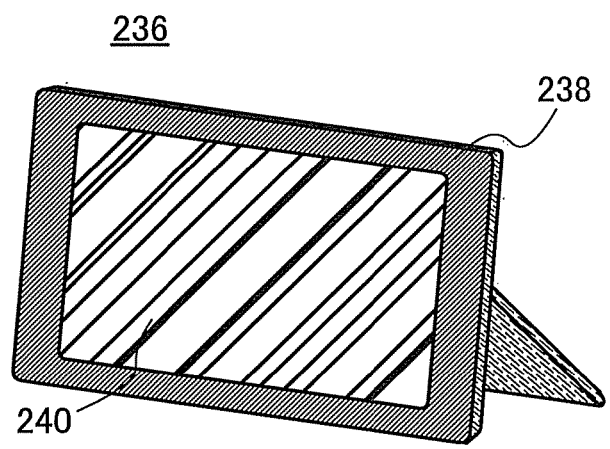

FIG. 16B illustrates an example of a digital photo frame. For example, in a digital photo frame 236, a display portion 240 is incorporated in a housing 238. The display portion 240 can display various kinds of images. For example, the display portion 240 can display data of an image shot by a digital camera or the like, and thereby functioning as a normal photo frame.

Note that the digital photo frame 236 is provided with an operation portion, an external connection terminal (a USB terminal, a terminal connectable to various cables such as a USB cable, or the like), a recording medium insertion portion, and the like. Although these components may be provided on the surface on which the display portion is provided, it is preferable to provide them on the side surface or the back surface for the design of the digital photo frame 236. For example, a memory storing data of an image shot by a digital camera is inserted into the recording medium insertion portion of the digital photo frame, whereby the image data can be transferred and then displayed on the display portion 240.

The digital photo frame 236 may have a configuration capable of wirelessly transmitting and receiving data. Through wireless communication, desired image data can be downloaded and be displayed.

Figure 17:
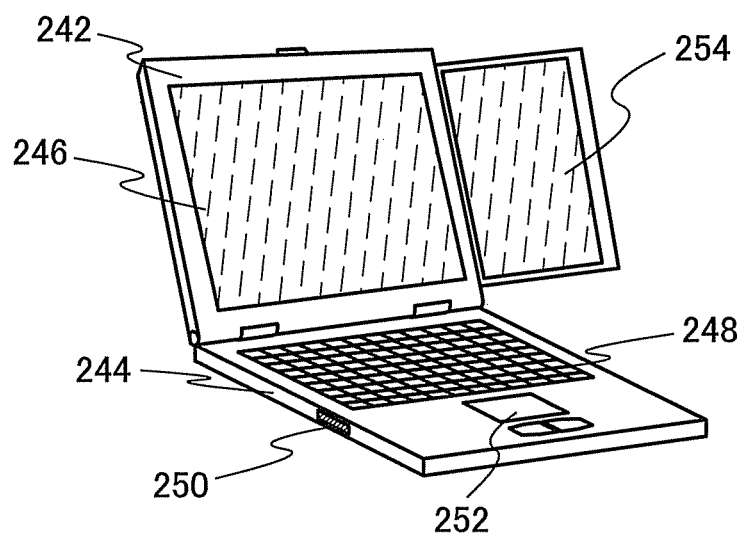
FIG. 17 illustrates a semiconductor device to which a display device of one embodiment of the present invention is applied.

FIG. 17 is a perspective view illustrating an example of a portable computer.

In a portable computer in FIG. 17, a top housing 242 having a display portion 246 and a bottom housing 244 having a keyboard 248 can overlap with each other by closing the portable computer with a hinge unit which connects the top housing 242 and the bottom housing 244. The portable computer is convenient for carrying around. Moreover, in the case of using the keyboard for input, the portable computer is open with the hinge unit so that a user can input looking at the display portion 246.

The bottom housing 244 includes a pointing device 252 with which input can be performed, in addition to the keyboard 248. Further, when the display portion 246 is used as a touch input panel, input can be performed by touching part of the display portion. The bottom housing 244 includes an arithmetic function portion such as a CPU or hard disk. In addition, the bottom housing 244 includes an external connection port 250 into which another device such as a communication cable conformable to communication standards of a USB is inserted.

The top housing 242 further includes a display portion 254 which can be stored in the top housing 242 by being slid therein. With the display portion 254, a large display screen can be realized. In addition, the user can adjust the orientation of a screen of the storable display portion 254. When the storable display portion 254 is used as a touch input panel, input can be performed by touching part of the storable display portion.

The display portion 246 or the storable display portion 254 is formed using an image display device such as a liquid crystal display panel or a light-emitting display panel including an organic light-emitting element, an inorganic light-emitting element, or the like.

In addition, the portable computer in FIG. 17 can be provided with a receiver and the like and can receive television broadcasting to display images on the display portion. The user can watch television broadcasting when the whole screen of the display portion 254 is exposed by sliding the display portion 254 while the hinge unit which connects the top housing 242 and the bottom housing 244 is kept closed. In this case, the hinge unit is not opened and display is not performed on the display portion 246, and start up of only a circuit for displaying television broadcasting is performed. Therefore, power consumption can be minimized, which is advantageous for the portable computer whose battery capacity is limited.

This application is based on Japanese Patent Application serial No. 2010-267505 filed with the Japan Patent Office on Nov. 30, 2010, the entire contents of which are hereby incorporated by reference.

What is claimed is:

1. A method for manufacturing a display device, comprising the steps of:

forming a first conductive film over a substrate;
forming a first etching mask over the first conductive film;
processing the first conductive film with use of the first etching mask, whereby a gate electrode is formed;
removing the first etching mask;
forming a gate insulating layer over the gate electrode;
forming a semiconductor film over the gate insulating layer;
forming a second etching mask over the semiconductor film;
processing the semiconductor film with use of the second etching mask, whereby a semiconductor layer is formed;
removing the second etching mask;
forming a second conductive film over the gate insulating layer to cover the semiconductor layer;
forming a third etching mask over the second conductive film;
processing the second conductive film with use of the third etching mask, whereby a source electrode and a drain electrode are formed; and
removing the third etching mask,
wherein one of the source electrode and the drain electrode serves as a pixel electrode, and
wherein the other of the source electrode and the drain electrode serves as a signal line.

2. The method for manufacturing a display device, according to claim 1, wherein the second conductive film is transparent.

3. The method for manufacturing a display device, according to claim 1, further comprising the steps of:

after the step of removing the third etching mask, forming a sidewall insulating film over the gate insulating layer, the semiconductor layer, the source electrode, and the drain electrode;
etching the sidewall insulating film back to expose the source electrode and the drain electrode, whereby a sidewall insulating layer is formed;
forming a low resistant conductive layer on the other of the source electrode and the drain electrode by an electroplating method.

4. The method for manufacturing a display device, according to claim 1, further comprising the step of:

etching the source electrode and the drain electrode, after removing the third etching mask.

5. The method for manufacturing a display device, according to claim 3, further comprising the step of:

etching the source electrode and the drain electrode, after forming the low resistant conductive layer.

6. A method for manufacturing a display device, comprising the steps of:

forming a first conductive film over a substrate;
forming a first etching mask over the first conductive film;
processing the first conductive film with use of the first etching mask, whereby a gate electrode is formed;
removing the first etching mask;
forming a gate insulating layer over the gate electrode;
forming a semiconductor film over the gate insulating layer;
forming a second etching mask over the semiconductor film;
processing the semiconductor film with use of the second etching mask, whereby a semiconductor layer is formed;
removing the second etching mask;
forming a second conductive film over the gate insulating layer to cover the semiconductor layer;
forming a third etching mask over the second conductive film;

processing the second conductive film with use of the third etching mask, whereby a source electrode and a drain electrode are formed;

removing the third etching mask; and forming a low resistant conductive film, wherein one of the source electrode and the drain electrode serves as a pixel electrode, wherein the other of the source electrode and the drain electrode serves as a signal line, and wherein the low resistant conductive film is formed on the other of the source electrode and the drain electrode.

7. The method for manufacturing the display device, according to claim 6, wherein the second conductive film is transparent.

8. The method for manufacturing the display device, according to claim 6, wherein the low resistant conductive film is formed by an electroplating method.

9. The method for manufacturing a display device, according to claim 6, further comprising the steps of:

after the step of removing the third etching mask, forming a sidewall insulating film over the gate insulating layer, the semiconductor layer, the source electrode, and the drain electrode;

etching the sidewall insulating film back to expose the source electrode and the drain electrode, whereby a sidewall insulating layer is formed.

10. The method for manufacturing a display device, according to claim 6, further comprising the steps of:

after the step of removing the third etching mask, forming a protective mask by an inkjet method in a portion excluding a portion where a low resistant conductive layer is to be formed, and lifting off the protective mask after forming the low resistant conductive film, whereby the low resistant conductive layer is formed.

11. The method for manufacturing a display device, according to claim 10, further comprising the step of:

etching the source electrode and the drain electrode, after lifting off the protective mask.

12. The method for manufacturing a display device, according to claim 6, further comprising the steps of:

forming a fourth etching mask by an inkjet method in a region where a low resistant conductive layer is to be formed over the low resistant conductive film;

processing the low resistant conductive film with use of the fourth etching mask, whereby the low resistant conductive layer is formed; and removing the fourth etching mask.

13. The method for manufacturing a display device, according to claim 12, further comprising the step of:

etching the source electrode and the drain electrode, after removing the fourth etching mask.

* * * * *